United States Patent
Haines et al.

(10) Patent No.: US 11,837,422 B2
(45) Date of Patent: Dec. 5, 2023

(54) ELECTRONIC SWITCHING DEVICE AND SYSTEM

(71) Applicant: Pass & Seymour, Inc., Syracuse, NY (US)

(72) Inventors: Joshua P. Haines, Marcellus, NY (US); Richard M. Rohmer, Jordan, NY (US); Gerald R. Savicki, Jr., Canastota, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 0 days.

(21) Appl. No.: 17/060,256

(22) Filed: Oct. 1, 2020

(65) Prior Publication Data

US 2021/0020396 A1    Jan. 21, 2021

Related U.S. Application Data

(63) Continuation of application No. 15/456,704, filed on Mar. 13, 2017, now Pat. No. 10,796,870, which is a
(Continued)

(51) Int. Cl.
*G06F 3/041* (2006.01)
*H01H 47/22* (2006.01)
(Continued)

(52) U.S. Cl.
CPC .............. *H01H 47/22* (2013.01); *H01H 9/56* (2013.01); *H02G 3/081* (2013.01);
(Continued)

(58) Field of Classification Search
CPC .......... H01H 47/22; H01H 9/56; H01H 9/182; H01H 13/14; H01H 2239/07; H02G 3/081;
(Continued)

(56) References Cited

U.S. PATENT DOCUMENTS

| 5,594,238 | A | * | 1/1997 | Endruschat | E03C 1/057 |
| | | | | | 250/221 |
| 5,655,870 | A | * | 8/1997 | Yasuhara | B66F 9/07 |
| | | | | | 700/214 |
| 6,244,354 | B1 | * | 6/2001 | Van Vuuren | A01G 20/15 |
| | | | | | 172/19 |
| 6,750,564 | B2 | * | 6/2004 | Cencur | H03K 17/955 |
| | | | | | 307/116 |

(Continued)

FOREIGN PATENT DOCUMENTS

| CN | 2640609 Y | * | 9/2004 |
| CN | 102506024 A | * | 6/2012 |

*Primary Examiner* — Jared Fureman
*Assistant Examiner* — Esayas G Yeshaw
(74) *Attorney, Agent, or Firm* — BOND, SCHOENECK & KING, PLLC; Frederick Price

(57) ABSTRACT

The present invention is directed to an electronic switch device, the device including a housing assembly including a front cover assembly having a user accessible surface, a back body assembly, terminals configured to be coupled to an AC power source and the load; an antenna assembly including an antenna substrate disposed inside the housing assembly adjacent a portion of the front cover assembly, an antenna being disposed on the antenna substrate having a conductive grid structure; and a circuit assembly disposed inside the housing assembly coupled to the terminals, the circuit assembly comprising a printed circuit board, the printed circuit board including a ground plane, the circuit assembly being electrically connected to the antenna assembly via a conductor, the printed circuit board being separated from the antenna assembly by a predetermined distance, the circuit assembly including a relay switch having at least one solenoid winding connected to the circuit assembly and a set of contacts.

6 Claims, 30 Drawing Sheets

Related U.S. Application Data continuation of application No. 13/681,592, filed on Nov. 20, 2012, now Pat. No. 9,607,786.

(51) Int. Cl.

| | | |
|---|---|---|
| *H03K 17/96* | (2006.01) | |
| *H01H 9/56* | (2006.01) | |
| *H02G 3/08* | (2006.01) | |
| *H05K 5/00* | (2006.01) | |
| *H05K 5/03* | (2006.01) | |
| *H01H 9/18* | (2006.01) | |
| *H01H 13/14* | (2006.01) | |

(52) U.S. Cl.
CPC ......... *H03K 17/962* (2013.01); *H05K 5/0026* (2013.01); *H05K 5/03* (2013.01); *H01H 9/182* (2013.01); *H01H 13/14* (2013.01); *H01H 2239/07* (2013.01); *H03K 2217/960755* (2013.01)

(58) Field of Classification Search
CPC ..... H03K 17/962; H03K 2217/960755; H05K 5/0026; H05K 5/03
See application file for complete search history.

(56) References Cited

U.S. PATENT DOCUMENTS

| | | | | |
|---|---|---|---|---|
| 9,413,144 | B1* | 8/2016 | Ledbetter | H02B 3/00 |
| 10,796,870 | B2* | 10/2020 | Haines | H01H 47/22 |
| 2003/0080755 | A1* | 5/2003 | Kobayashi | G01D 5/2405 |
| | | | | 324/658 |
| 2005/0121602 | A1* | 6/2005 | Peng | H03K 17/941 |
| | | | | 250/221 |
| 2007/0291010 | A1* | 12/2007 | Altonen | H05B 39/085 |
| | | | | 345/173 |
| 2008/0274652 | A1* | 11/2008 | Li | B29C 45/14811 |
| | | | | 264/445 |
| 2009/0107829 | A1* | 4/2009 | Heimann | H03K 17/962 |
| | | | | 200/600 |
| 2012/0008285 | A1* | 1/2012 | Renkel, Jr. | H05K 7/1491 |
| | | | | 361/724 |
| 2013/0107486 | A1* | 5/2013 | Hiralal | H05K 1/162 |
| | | | | 29/830 |
| 2014/0106684 | A1* | 4/2014 | Burns | H01Q 21/28 |
| | | | | 29/601 |
| 2015/0255932 | A1* | 9/2015 | Dicks | H01R 13/6666 |
| | | | | 307/326 |
| 2016/0028148 | A1* | 1/2016 | Tan | H01Q 1/44 |
| | | | | 343/702 |

* cited by examiner

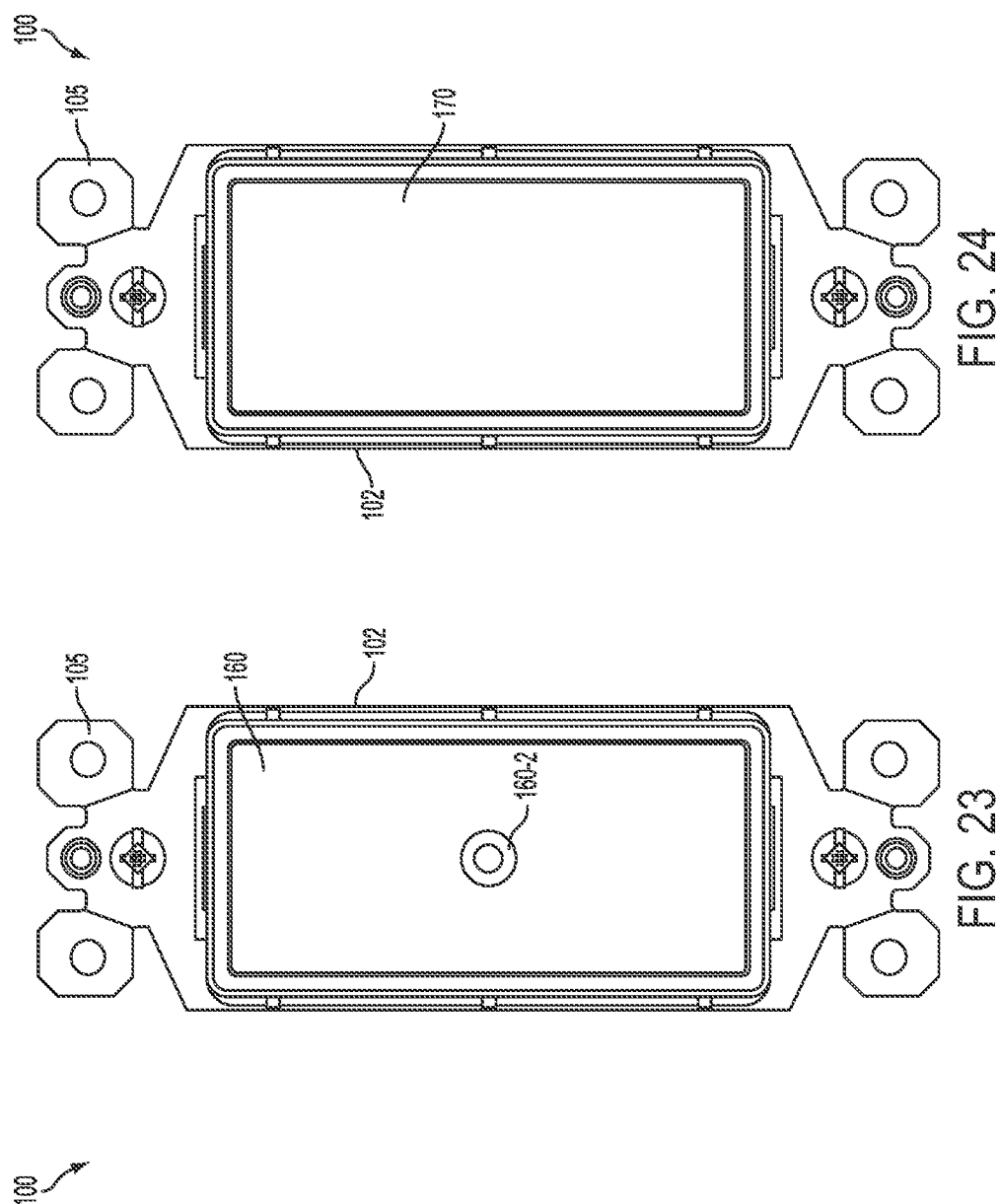

ELECTRONIC SWITCHING DEVICE AND SYSTEM

CROSS-REFERENCE TO RELATED APPLICATIONS

This application is a continuation of U.S. patent application Ser. No. 15/456,704, filed on Mar. 13, 2017, now U.S. patent Ser. No. 10/796,870, which is a continuation of and claims priority to and the benefit of, U.S. patent application Ser. No. 13/681,592, filed on Nov. 20, 2012, now U.S. Pat. No. 9,607,786 the disclosures of which are relied upon and hereby incorporated by reference in their respective entireties.

BACKGROUND OF THE INVENTION

1. Field of the Invention

The present invention relates generally to electrical devices, and particularly to electrical switch devices.

2. Technical Background

The conventional method for installing electrical circuits includes a rough-in phase and a finish phase. In the rough-in phase, conduit or cable is disposed throughout the structure in accordance with the building plans. Junction boxes are installed at appropriate locations to house electrical connection points where two or more conductors are spliced together. Device boxes are installed throughout the structure where electrical service is desired. After the boxes are placed, the electrical wires are pulled through the conduits (if provided) and all of the circuits are bonded.

After the "rough-in" phase has been completed, the electrical wiring devices are terminated, i.e., they are electrically connected to the wire leads. This part of the installation process is typically performed or supervised by a journeyman electrician. Subsequently, the ground strap of the electrical wiring device is mounted to the device box. One or more electrical wiring devices may be mounted to a device box depending on its size. A single-gang device box typically accommodates one electrical wiring device, a two-gang device box will typically accommodate two electrical wiring devices; and so on and so forth. Once an electrical wiring device is installed inside the device box, a cover plate is disposed over the electrical wiring device to "complete the electrical enclosure" such that individuals are not exposed to "hot" electrical wiring after the electrical power is turned ON.

There are several drawbacks associated with conventional installation methods and conventional wiring devices. Conventional wiring devices often do not make efficient use of space due to their one-size-fits-all device box designs. What is needed, for example, is an electrical switching device that makes more efficient use of the available space, e.g., one that does not require all of the space available in a single gang device box.

Mounting the ground strap of an electrical wiring device to the device box is tedious, time consuming, and therefore costly. The same can be said of mounting the cover plate to the electrical wiring device. In multi-gang installations, the finished look is often ragged because the electrical devices and the cover plates are not in alignment. The misalignment is often in all three dimensions. Retrofitting an installation can also be problematic from a finished look standpoint because the device box or an old work box may not be precisely aligned to the plane of the wall surface. Moreover, the wall surface itself may be uneven. After remodeling a space, homeowners often seek to replace an existing wall plate with one that better matches the new décor. Thus, a homeowner may inadvisably remove the faceplate cover from an energized wiring device and inadvertently become exposed to a shock hazard from the "hot" electrical wiring. What is needed therefore is a modular electrical wiring device system that addresses the drawbacks articulated above.

Electrical switches are a well-known type of electrical wiring device and are commonly employed as, e.g., light switches. "Toggle" switches include single pole single throw (SPST) switches that are used to mechanically switch lights between an ON state and an OFF state. One drawback to these types of switches is that a light must turned ON/OFF from one location. A light may be controlled from two locations by using three way toggle switches, i.e., by employing two single pole double throw switches (SPDT). Each SPDT switch depends on the switch position of the other. When one SPDT switch turns a light ON, it is because the switch position of the other SPDT was in a switch position that resulted in the light being previously OFF. Thus, the two SPDT work in tandem such that the light may be controlled at two locations. Certain switches of this type incorporate a bistable latching relays. Latching relays often include solenoids that are electrically actuated by a low power signal. Some of the drawbacks associated with relay switches relate to degradation, fatigue, undesired arcing and excessive leakage current to ground. What is needed therefore is an electrical switch that addresses these drawbacks.

Another drawback of electrical switches is that their manual actuators are substantially flat, making them hard to find in a darkened room. One solution has been to include pilot lights, but they add expense and are visually obtrusive. What is needed therefore is an electrical switch that addresses this drawback.

The concept of modularity may also be extended to electrical switches. As noted above, after remodeling a space, homeowners often seek to replace an existing switch with one that better matches the new décor. Again, the homeowner may inadvisably attempt to replace the existing electrical switch with a new device and become exposed to a shock hazard from the "hot" electrical wiring. A modular electrical switch that addresses the needs previously identified is also desirable. What is also needed is a modular electrical switch that is interchangeable; i.e., it allows for the removal of the actuator portion without becoming exposed to shock or electrocution.

SUMMARY OF THE INVENTION

The present invention is directed to an electrical switching system that addresses the needs described above.

One aspect of the present invention is directed to an electronic switch device for controlling a load. The device comprises a housing assembly including a front cover assembly having a user interface, a back body assembly, and a plurality of terminals configured to be coupled to an AC power source and the load. A circuit assembly is coupled to the plurality of terminals. The circuit assembly includes a relay switch having a commutator and a set of contacts. The relay switch is characterized by a predetermined commutator period, the predetermined commutator period being substantially the commutator travel time between the set of contacts during a relay switch actuation. The circuit assembly further includes an actuation circuit configured to provide a constant current actuation signal that energizes the relay switch in response to an input stimulus via the user interface such that an end of the predetermined commutator period substantially coincides with a predetermined point in an AC power cycle.

In another aspect, the present invention is directed to an electronic switch device that comprises a housing assembly including a plurality of terminals configured to be coupled to an AC power source and a load. The housing assembly also includes a user interface and a sensitivity adjustment interface. A circuit assembly is coupled to the plurality of terminals. The circuit assembly includes a relay switch having a commutator and a set of contacts. The relay switch is characterized by a commutator period, the commutator period being substantially the commutator travel time between the set of contacts. The circuit assembly also includes a sensor detector receptor portion coupled to the user interface and configured to sense perturbations of a signal parameter. The circuit assembly also includes a sensor detector coupled to the sensor receptor portion. The sensor detector is configured to determine whether the perturbations of the signal parameter correspond to a switch actuation command in accordance with a detection rule. The circuit assembly also includes a regulation circuit coupled to the sensitivity adjustment interface and the sensor detector. The regulation circuit is configured to adjust the detection rule in accordance with a setting of the sensitivity adjustment interface and direct the relay switch to actuate in response to the switch actuation command in accordance with a selected sensitivity adjustment.

In yet another aspect, the present invention is directed to an electronic switch device configured to be installed within a device box, the device comprises a housing assembly that includes a plurality of terminals configured to be coupled to an AC power source. The housing assembly further includes a first circuit assembly coupled to the plurality of terminals. The first circuit assembly includes a relay switch having a commutator and a set of contacts, the relay switch being characterized by a commutator period, the commutator period being substantially the commutator travel time between the set of contacts. An interchangeable switch module is configured to be coupled and decoupled from the housing assembly. The interchangeable switch module is selected from a plurality of interchangeable switch modules. Each interchangeable switch module is characterized by a user interface that is implemented by one of a plurality of switching technologies. The interchangeable switch module also includes a second circuit assembly coupled to the first circuit assembly when the interchangeable switch module is coupled to the housing assembly. The second circuit assembly propagates a constant current actuation signal that energizes the relay switch in response to an input stimulus via the user interface such that an end of the predetermined commutator period substantially coincides with a predetermined point in an AC power cycle.

In a further aspect, an electronic switch device for controlling a load, the device can include a housing assembly including a front cover assembly having a user accessible surface, a back body assembly, a plurality of terminals configured to be coupled to an AC power source and the load; an antenna assembly comprising an antenna substrate disposed inside the housing assembly adjacent a portion of the front cover assembly, an antenna being disposed on the antenna substrate having a conductive grid structure; and a circuit assembly disposed inside the housing assembly coupled to the plurality of terminals, the circuit assembly comprising a printed circuit board, the printed circuit board including a ground plane, the circuit assembly being electrically connected to the antenna assembly via a conductor, the printed circuit board being separated from the antenna assembly by a predetermined distance, the circuit assembly including a relay switch having at least one solenoid winding connected to the circuit assembly and a set of contacts.

In accordance with an embodiment, the conductive grid structure is made of copper.

In accordance with an embodiment, the predetermined distance is about ⅛ inch.

In accordance with an embodiment, the conductive grid structure is substantially the size of the user accessible surface.

In accordance with an embodiment, a cover plate is adapted to cover the electronic switch device following installation, the cover plate including an aperture configured to receive the user accessible surface of the front cover when the cover plate is attached to the electronic switch device.

In accordance with an embodiment, the conductive grid structure is substantially the size of the user accessible surface.

In accordance with an embodiment, a cover plate is adapted to cover the electronic switch device following installation, the cover plate including an aperture configured to receive the user accessible surface of the front cover when the cover plate is attached to the electronic switch device.

In accordance with an embodiment, the predetermined point in an AC power cycle corresponds to a zero crossing of the AC power cycle.

In accordance with an embodiment, the signal is an electric field, the electric field is free from interference through predetermined placement of a ground plane within the device, wherein the ground plane is positioned at least ⅛ inch away from an antenna contact point, the ground plane is further positioned such that the electric field does not interfere with low voltage control circuitry.

In accordance with an embodiment, the distance between the antenna and ground plane is achieved by placing the antenna and ground plane on separate respective PCBs with a distance of at least ⅛ inch between the separate respective PCBs.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

FIG. 23 is a front view of an electronic switch in accordance with yet another embodiment of the present invention;

FIG. 24 is a front view of an electronic switch in accordance with yet another embodiment of the present invention.

DETAILED DESCRIPTION

Figure 5A:
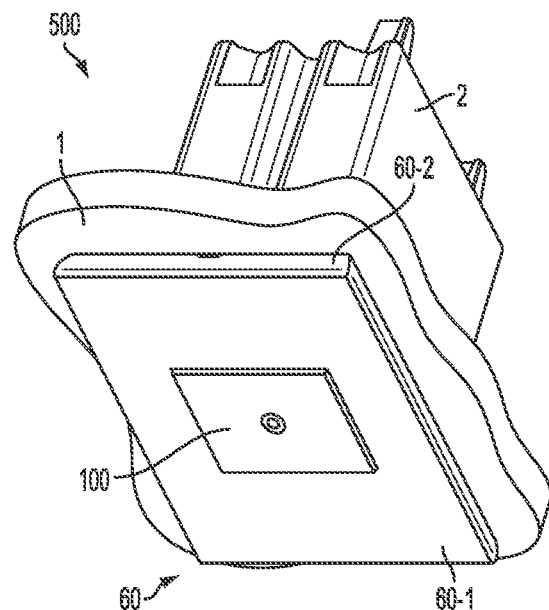
FIGS. 5A-5C are perspective views of a modular electrical wiring system showing an electrical switching device in conjunction with an aesthetic overlays 60 in accordance with the present invention.
Figure 5B:
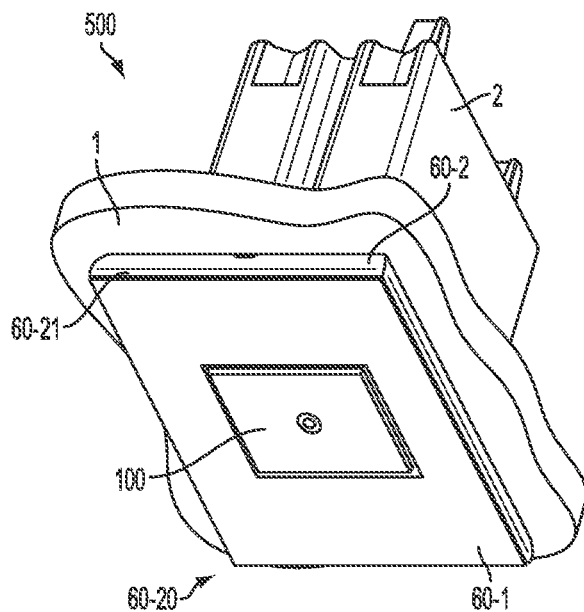
Figure 5C:
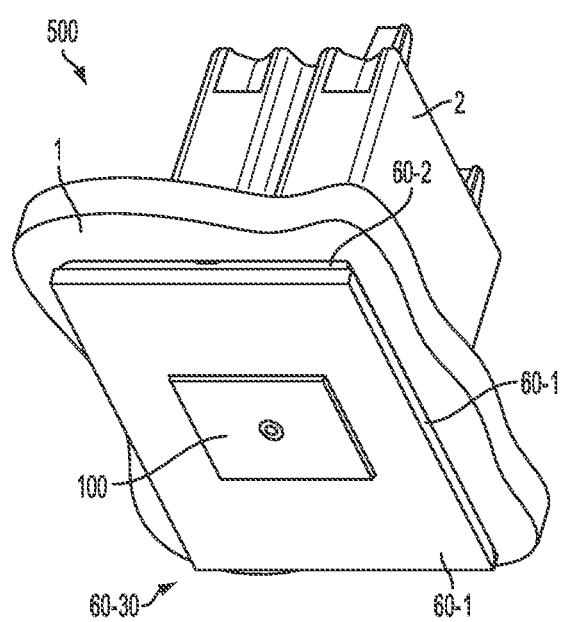
Figure 6:
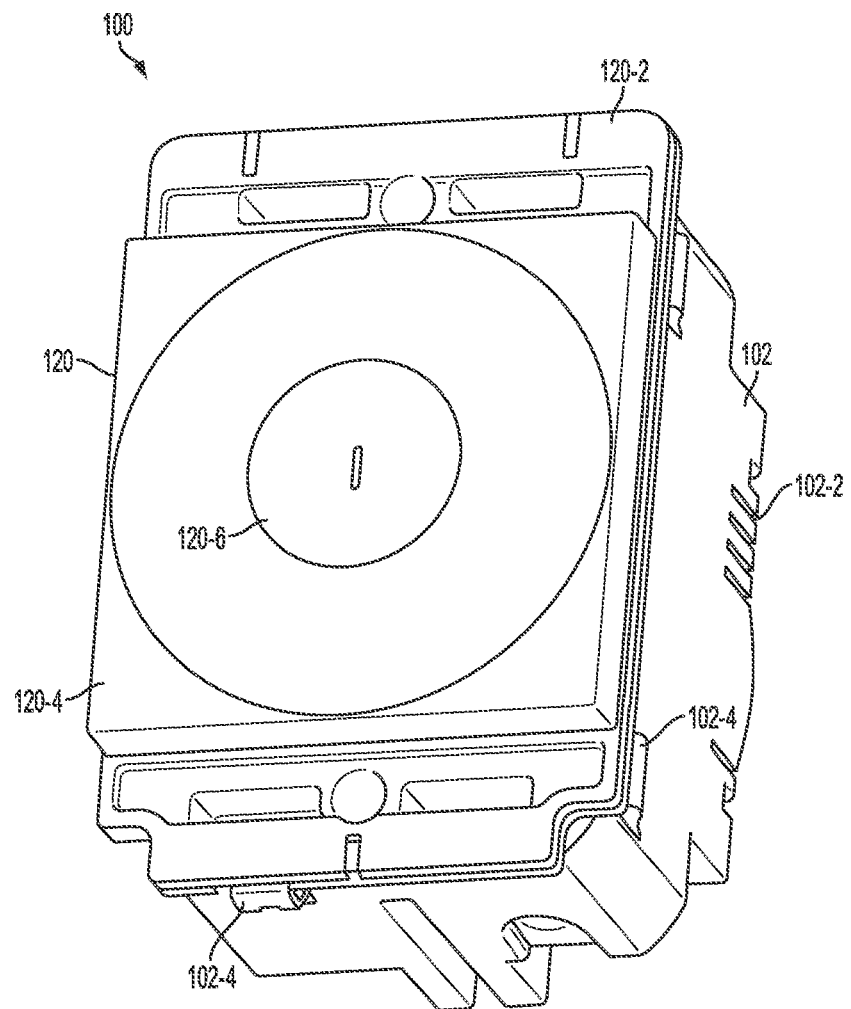
FIG. 6 is a perspective view of an electronic wave switch in accordance with one embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the frame is shown in FIGS. 1-4, and is designated throughout as reference number 10. An exemplary embodiment of the electrical switch device of the present invention is shown in FIG. 6, and is designated generally throughout by reference numeral 100. An exemplary embodiment of the framing system that includes the frame member, frame components, and switch 100 is shown in FIGS. 5A-5C and is designated generally throughout by reference numeral 500.

Figures 1A, 1B:
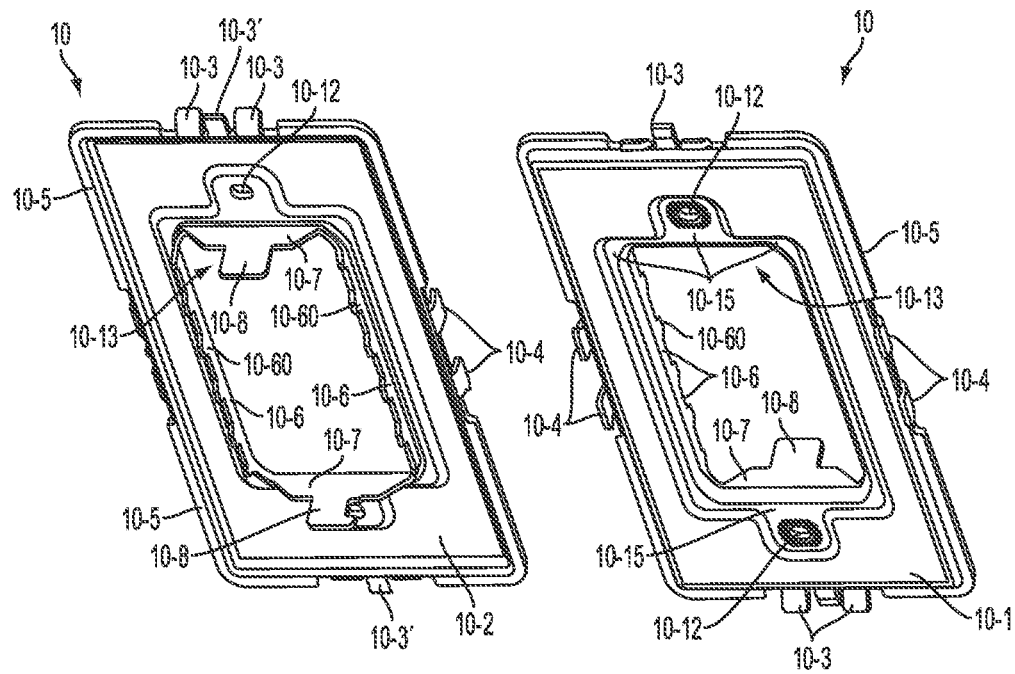
FIGS. 1A-1B are perspective views of a frame member in accordance with the present invention.

As embodied herein, and depicted in FIGS. 1A-1B perspective views of a frame member in accordance with the present invention are disclosed. FIG. 1A is directed to the rear side 10-2 of the frame member 10 and FIG. 1B is directed to the front side 10-1 of the frame member 10. Reference is made to U.S. patent application Ser. No. 13/680,675, filed on Nov. 19, 2012, which is incorporated herein by reference as though fully set forth in its entirety, for a more detailed explanation of the framing system shown in FIGS. 1-5. The frame member 10 is configured to "complete the electrical enclosure" when the modular electrical device is properly installed within the frame device opening 10-13. Stated differently, instead of using a conventional wall plate to complete the enclosure, the present invention counter-intuitively endows the frame with the function of preventing individuals from being exposed to hot electrical wiring in the device box when the device is energized.

One way the enclosure is completed is by providing a frame enclosure lip 10-5 around the perimeter of the frame. The frame lip 10-5 is configured to abut the adjacent wall surface such that the edge of the properly installed wall box cannot touch the rear side of the frame because of the frame lip 10-5. This is true even when old work boxes having flanges that mount to the outer surface of the sheet rock are used. The lip 10-5 does not interfere with the old work box flanges; it allows the frame 10 to abut the wall surface. The frame 10 also includes a frame opening 10-13. The edges of the frame opening 10-13 are configured to abut modular alignment connectors 20, or electrical wiring devices 100, in the manner disclosed below. Once the frame is installed and the opening 10-13 is filled with one or more electrical wiring devices and/or one or more modular alignment connectors 20, the enclosure is completed.

The frame 10 further includes interior serrated wall members 10-6 and connector landing elements 10-7 that extend around the perimeter of the frame device opening 10-13 to form an integral rim or skirt that is inserted into the device box. The serrated wall members 10-6 are disposed along the sides of the opening 10-13 whereas the landing elements are disposed at either end of the opening 10-13. Each landing element 10-7 includes a ground connection tab 10-8. Thus, the region of the frame 10 disposed between the enclosure lip 10-5 and the integral rim (formed by 10-7 and 10-8) covers the wall surface 1. Once the wall box screws/fasteners 10-10 (not shown) are inserted into the fastener slots 10-12 and tightened, the only way of accessing the interior of the device box is via the frame opening 10-13 which is completely filled by modular alignment connectors 20 and/or a modular wiring device 100 after installation. In another embodiment, the modular wiring device may be configured to completely fill the enclosure.

Figure 2A:
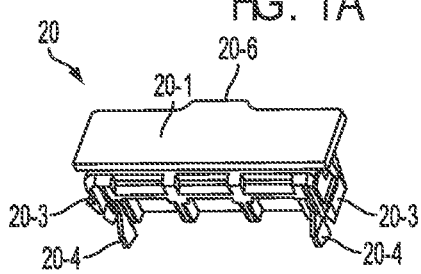
FIGS. 2A-2D are perspective views of a modular alignment connector in accordance with the present invention.

As embodied herein and depicted in FIGS. 2A-2D, perspective views of a modular alignment connector 20 in accordance with the present invention are disclosed. FIG. 2A shows the front major surface 20-1 of the modular alignment connector 20 when it is inserted within the opening 10-13 of the frame 10. The connector front surface 20-1 includes a front connector flange 20-6 which is configured to fit within the frame connector seat 10-15 when the connector is disposed within the frame 10. The modular alignment connector 20 further includes bending snap arms 20-3, spacer tangs 20-4, and a spacer channel 20-5 disposed therebetween. The bending snap arms 20-3 are provided on either side of the connector 20 to allow the connector 20 to snap into the frame when inserted into the opening 10-13. The spacer tang 20-4 is used to lock the modular alignment connector 20 into the frame 10. Briefly stated, connector 20 is locked when the spacer tang 20-4 is pressed into the spacer channel 20-5 (see, e.g., FIG. 2D). As its name suggests, the modular alignment connector 20 provides a correctly sized frame opening 10-13 such that various combinations of wiring devices complete the opening when they are installed in frame 10. In particular, the frame opening is configured to accommodate three "one-module" sized wiring devices. A "two-module" sized device requires two modular alignment connectors 20 to complete the opening. A "three-module" sized device is inserted into the frame opening 10-13 to complete the enclosure. The snap connect assembly (20-3, 20-4, and 20-5) is configured to withstand at least 50 foot-pounds of pulling force.

Figure 2B:
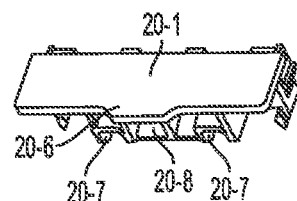

FIG. 2B shows the modular connector 20 rotated 180° with respect to the view provided by FIG. 2A. In this view, the connector 20 is shown to include a front stabilizing plate 20-6 that works in conjunction with the frame's rear connector flanges 20-7 to form a connector channel 20-8 that is sized to be seated on, and grip, the frame connector landing 10-7 (shown in FIGS. 1A and 1B). The stabilizing plate 20-6 is also configured to overlay a portion of frame front face 10-1 (FIG. 1B) when the modular alignment connector 20 is inserted into, and fully seated at the end of the opening 10-13. Stated briefly, the front stabilizing plate 20-6 is configured to prevent the modular alignment connector 20 from being pushed inwardly through the opening 10-13.

Figure 2C:
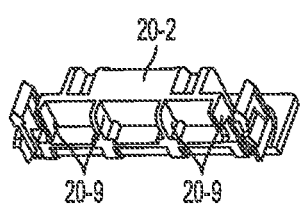

FIG. 2C is a rear view of the modular alignment connector 20 and shows the rear major surface 20-2 which forms a ledge having device stop elements 20-9 extending downwardly therefrom. The device stop elements 20-9 have the same or similar function as the serrated stop elements 10-60 formed in the interior serrated wall 10-6 of the frame 10. Reference is made to U.S. patent application Ser. No. 13/680,675, filed on Nov. 19, 2012, which is incorporated herein by reference as though fully set forth in its entirety, for a more detailed explanation of the framing system that includes the elements (10-60, 20-9) configured to mate with the snap elements formed in the back body portion 102 of the modular devices. All of these elements work together to complete the electrical enclosure such that the user cannot obtain access to hot electrical wiring. Moreover, the modular wiring devices 100 is prevented from moving laterally within the frame opening when the device snaps are snapped into place within elements 10-60 and 20-9. Stated briefly, the aforementioned elements work together to secure and align electrical wiring device(s) within the opening 10-13.

Figure 2D:
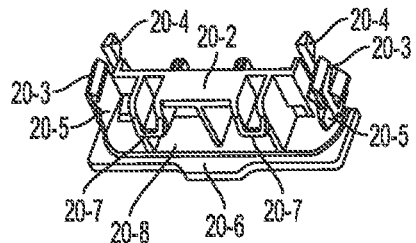

FIG. 2D shows the modular connector 20 rotated 180° with respect to the view provided by FIG. 2C. When the connector 20 is installed into the opening 10-13, the bending snap arms 20-3 are deflected inwardly until they snap into the serrations 10-60 formed in interior serrated walls 10-6. This snap-fit arrangement prevents helps to secure the connector 20 within the opening 10-13. Note that when the connector 20 is in this position, the rear stabilizing plate 20-7 bears against edges of connector landing 10-7 (shown in FIG. 1). Altogether, the snap-arms, front stabilizing plate 20-6 and the rear stabilizing plate 20-7 restrict the movement of the modular alignment connector 20 such that it is prevented from moving in or out of the opening 10-13 once the connector 20 is installed within the opening 10-13.

Figure 3:
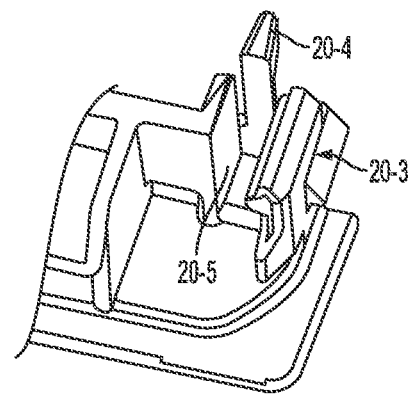
FIG. 3 is a detail view of the modular alignment connector depicted in FIGS. 2A-2D.

FIG. 3 is a detail view of the modular alignment connector 20 depicted in FIGS. 2A-2D. This is yet another view of the bending snap arm 20-3, the spacer tang 20-4, and the spacer channel 20-5 therebetween. In this view, the snap fit arm 20-3 is shown being deflected inwardly as the connector 20 is being inserted into the opening 10-13. Once the snap-arms 20-3 snap or deflect outwardly into the serrations 10-60 (shown in FIG. 1), the spacer tang 20-4 may be pressed into channel 20-5 to lock the modular alignment connector within the opening 10-13.

Figure 4A:
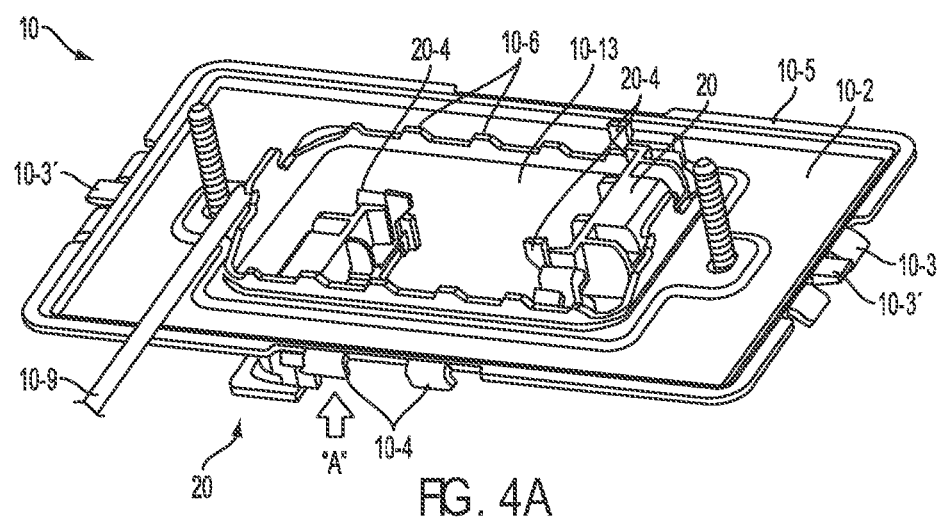
FIGS. 4A-4E are illustrative views showing installation details of the frame, modular alignment connector and electrical wiring device.
Figure 4B:
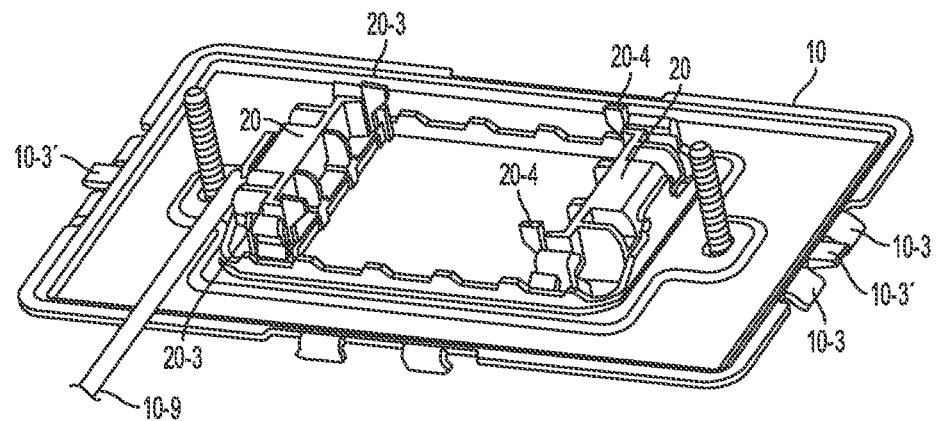

Referring to FIGS. 4A-4E, illustrative views showing installation details of the frame 10, modular alignment connector 20 and electrical wiring device 40 are disclosed. In FIG. 4A, a modular alignment connector 20 is shown as being inserted into opening 10-13 of frame 10 by the direction of the arrow. Another modular alignment connector is shown as being previously installed at the opposite end of the opening 10-13. As depicted in FIG. 4B, both of the modular alignment connectors 20 are shown as being installed and locked into the opening 10-13.

Figure 4C:
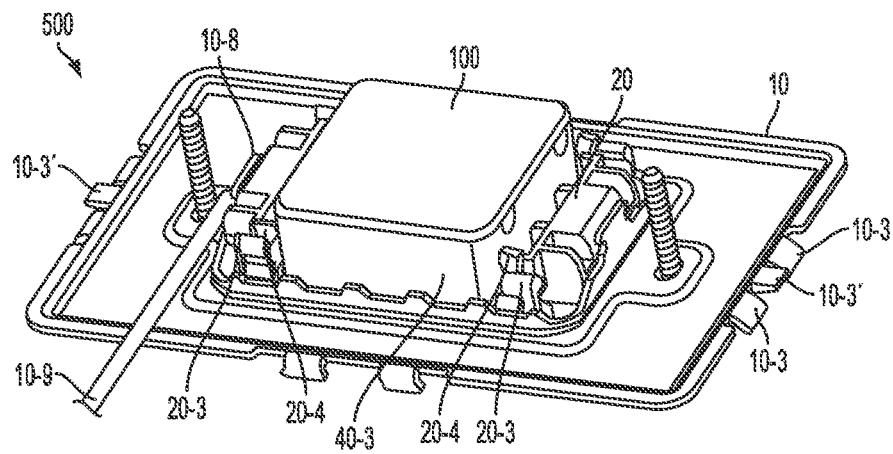

In FIG. 4C, a wiring device 100 is shown as being inserted between the modular alignment connectors 20. Note that a portion of the device 100 bears against the spacer tangs 20-4. As noted previously, the tangs 20-4 are inserted to prevent the snaps 20-3 from disengaging the frame opening 10-13. Once the device 40 is installed, therefore, the spacer tangs 20-4 function as a stop that prevents the device 100 from falling through the opening 10-13. Stated differently, once device 100 is installed into the frame opening 10-13, the modular alignment connectors are locked into place and cannot be removed. FIG. 4C also shows a ground wire 10-9 that extends from the ground connection tab 10-8.

Figures 4D, 4E:
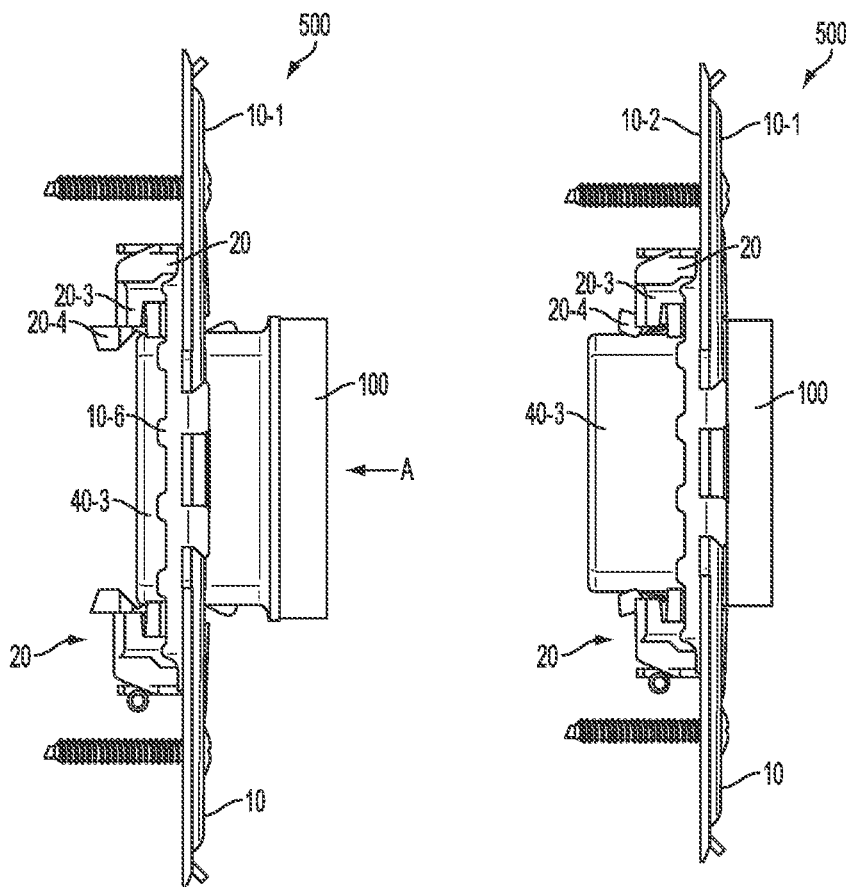

FIG. 4D is a side view that shows device 100 being inserted into the frame opening 10-13 by the direction of the arrow. FIG. 4E shows the device 100 being fully installed in the frame opening 10-13 with alignment connectors 20 disposed at either end thereof. Reference is made to U.S. patent application Ser. No. 13/680,675, filed on Nov. 19, 2012, which is incorporated herein by reference as though fully set forth in its entirety, for a more detailed explanation of the framing system and the method of removing a modular device 100 from the frame.

Referring to FIGS. 5A-5C, various perspective views of the modular electrical wiring system 500 are disclosed. System 500 is shown to include the electrical switching device 100 in combination with the aesthetic overlays 60. The aesthetic overlays are depicted in FIGS. 12, 13 and 14, of U.S. patent application Ser. No. 13/680,675 referenced above. As noted therein, each type of aesthetic overlay (60, 60-20 and 60-30) disclosed in the provisional application substantially abuts the adjacent wall surface 1 by virtue of a ratcheting overlay snap 10-3. This feature allows system 500 to accommodate uneven wall surfaces. As alluded to above, wall box 2 may be a pre-existing wall box disposed in a pre-existing electrical distribution system. Thus, the present invention readily accommodates existing installations.

As embodied herein and depicted in FIG. 6, a perspective view of an electronic wave switch 100 in accordance with one embodiment of the present invention is disclosed. Again, like every embodiment of the present invention, when the device 100 is inserted into the frame opening 10-13 (see FIGS. 1-4), the user is not exposed to any of the electrical wiring stowed in the device box. Having said this, the electronic wave switch 100 includes a wave switch actuator assembly 120 coupled to a back body 102. The back body 102 includes heat dissipation vents 102-2. The actuator assembly 120 includes an enclosure portion 120-2 that mates with the back body 102 to form a device housing. The actuator assembly 120 includes an aesthetic cover portion 120-4 that is connected to the enclosure portion 120-2. An infrared ("IR") lens 120-6 is disposed in the center portion of the aesthetic cover 120-4. The wave switch device 10 is configured to actuate whenever a user waves his hand (or some other object) in front of the lens 120-6.

Figure 7:
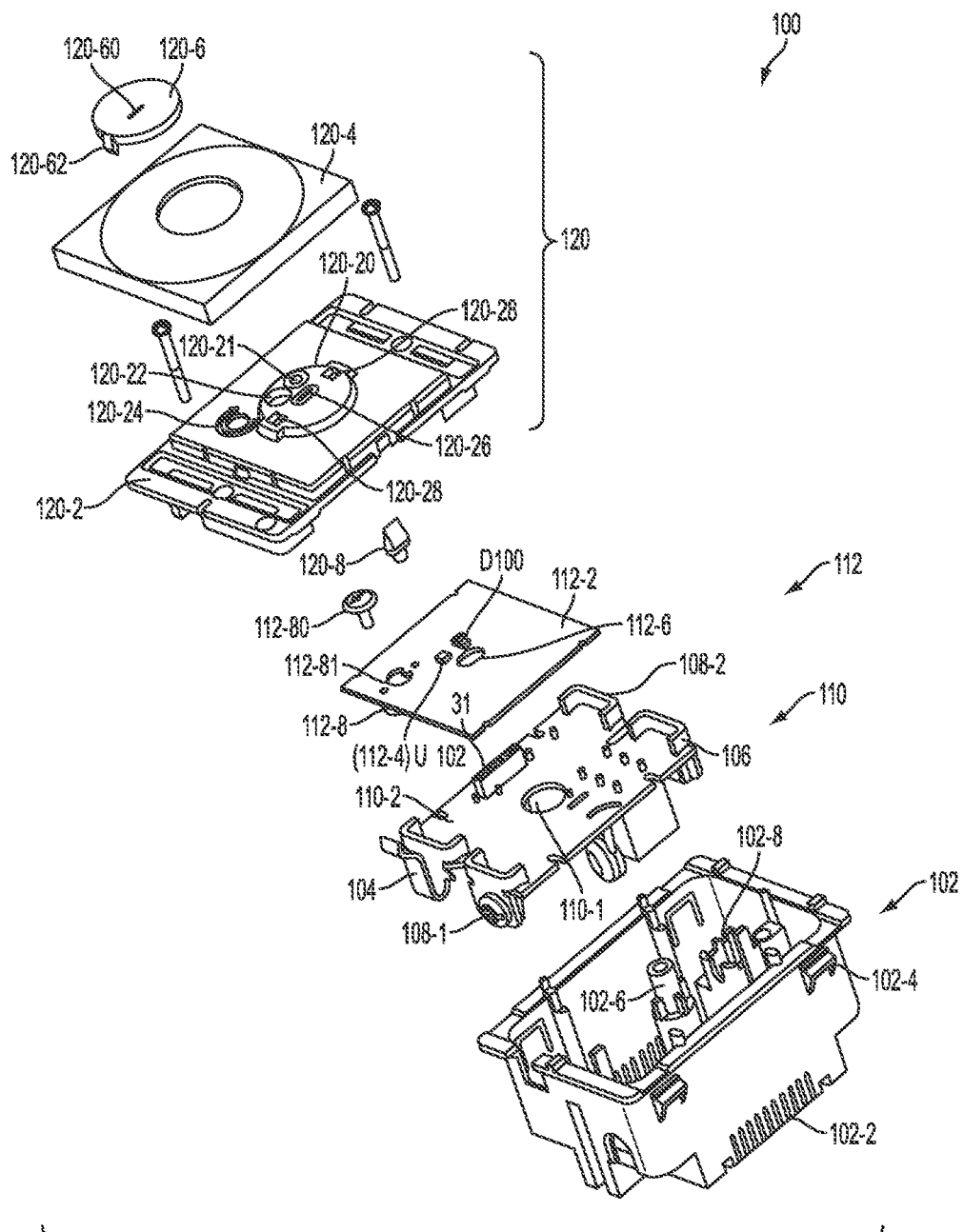
FIG. 7 is an exploded view of the electronic wave switch depicted in FIG. 6.

Referring to FIG. 7, an exploded view of the electronic wave switch 100 depicted in FIG. 6 is disclosed. The electronic wave switch device 100 includes an AC power circuit 110 disposed within the back body 102. The AC power circuit 110 provides power to an electronic actuator circuit 112 that is disposed in the wave switch actuator assembly 120. The electronic actuator circuit 112 is spaced apart from the AC power circuit 110. The back body assembly 102 and the AC power circuit 110 are identical for each of the embodiments disclosed herein.

The back body 102 includes heat dissipation vents 102-2 that allow thermal energy generated by the electronics to vent and dissipate. Snaps 102-4 are formed along the perimeter of the back body member 102 and are configured to engage frame 10 in the manner described above. Stated differently, the electronic wave switch 100 is mounted within the frame and not to the device box; thus, the device 100 does not include and does not require amounting strap. The back body 102 includes an LED tube 102-6 that is formed in the center portion thereof. The light tube 102-6 is configured to accommodate an LED locator light 118 (not shown in the view) that extends through the center portion of the device 100 through various openings (110-1, 112-6, etc.). The back body 102 also includes ribbing of various shapes and sizes that accommodate and space apart the printed circuit boards (PCBs 110, 112).

The AC power circuit 110 is disposed on a printed circuit board (PCB) 110-2 and shown schematically in FIG. 10. The PCB 110-2 includes a central aperture 110-1 that allows the LED tube 102-6 to extend there through. A plurality of terminal structures (104, 106, 108-1, and 108-2) are connected to the PCB 110-2 around its periphery. For example, a ground clip terminal 104 is configured to engage the ground connection tab 10-8 (See FIG. 4C). The ground clip 104 provides the power supply return path (See FIG. 10) with an "earth link" to the frame 10. As shown in FIGS. 4A-4C, the frame 10 includes a ground wire 10-9 that can be attached to the ground tab 10-8 by any suitable means.

Figure 11A:
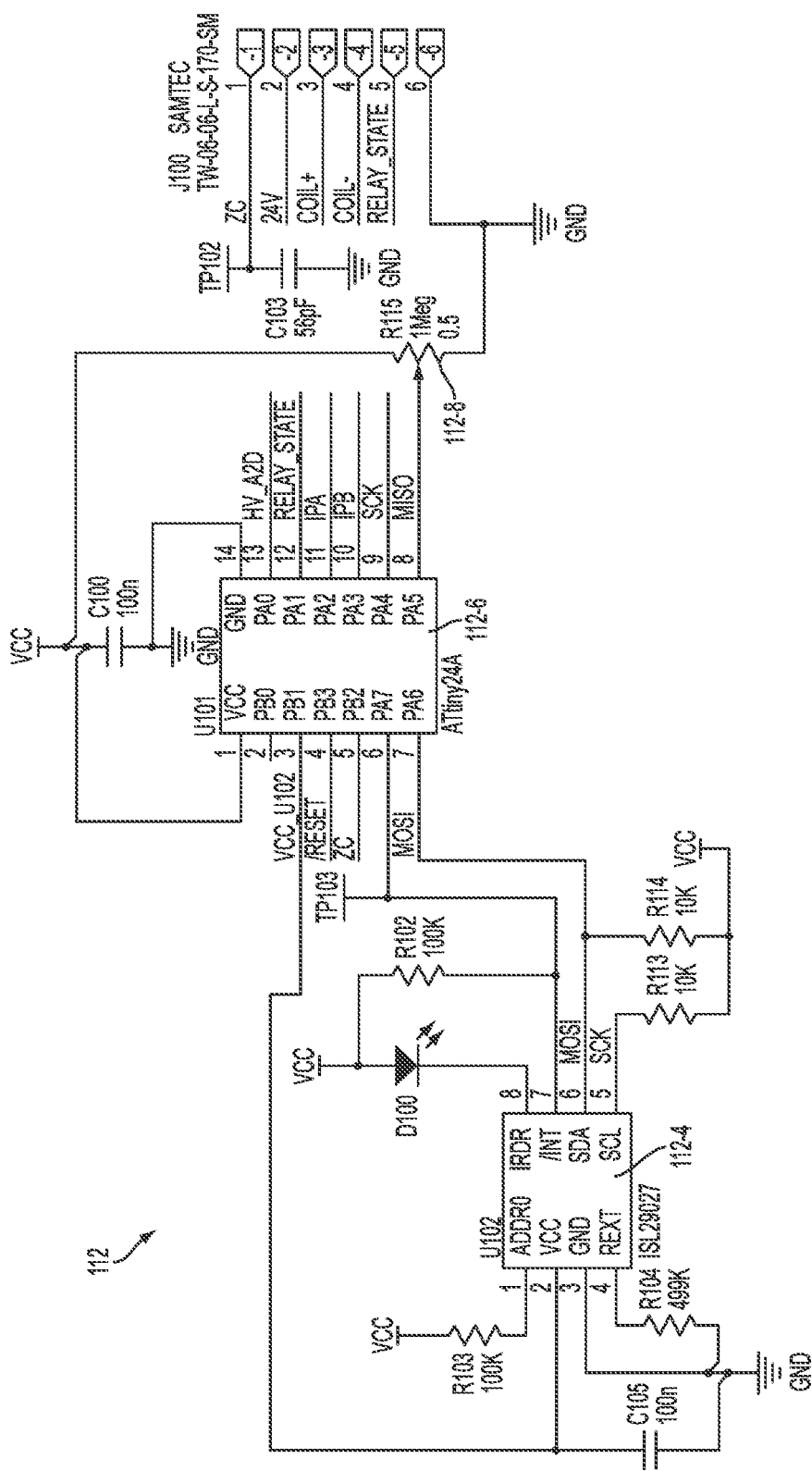
FIGS. 11A-11D are schematic diagrams of the low voltage PCB of the electronic wave switch depicted in FIG. 7.

The electronic actuator circuit 112 is disposed on PCB 112-2 and is shown schematically in FIGS. 11A-11D. A sensor adjustment aperture 112-81 is formed in a corner portion of the PCB 112-2 and accommodates the sensor adjustor 112-80. The sensor adjustor 112-80 is coupled to a potentiometer 112-8 (R115), which is also shown in FIG. 11A. The potentiometer 112-8 controls the sensitivity of the sensor 112-4 (U102), which is also mounted on PCB 112-2. An IR LED D100 is also mounted on the PCB 112-2 adjacent to the sensor 112-4 (U102). The function of these components will be described below in the description of FIG. 11A. A central aperture 112-6 is formed in PCB 112-2 and is configured to allow the LED tube 102-6 to extend there through. The electronic actuator PCB 112-2 is positioned within the enclosure 120-2 by several rib elements 102-8 formed in the back body 102.

The wave switch actuator assembly 120 includes enclosure portion 120-2, an aesthetic cover 120-4 and an IR lens element 120-6. The enclosure portion 120-2 includes a raised cylindrically shaped plateau 120-20 that includes several apertures (120-21, 120-22, 120-26 and 120-28) formed therein. The LED aperture 120-21 is aligned with an IR LED (D100) mounted on PCB 112-2. The sensor aperture 120-22 is aligned with the sensor integrated chip (IC) U102, which is also mounted on PCB 112-2. An oblong aperture 120-26 is disposed adjacent to apertures 120-21, 120-22 and is configured to receive the locator LED light pipe element 120-8 from underneath the enclosure portion 120-2. Snapholes 120-28 are disposed at either end of the cylindrical portion 120-20 and are configured to accept the snaps 120-62 formed along the periphery of IR lens 120-6. As described below, an aesthetic cover 120-4 and an IR lens 120-6 are configured to be connected to enclosure 120-2 to complete the assembly.

Figure 8A:
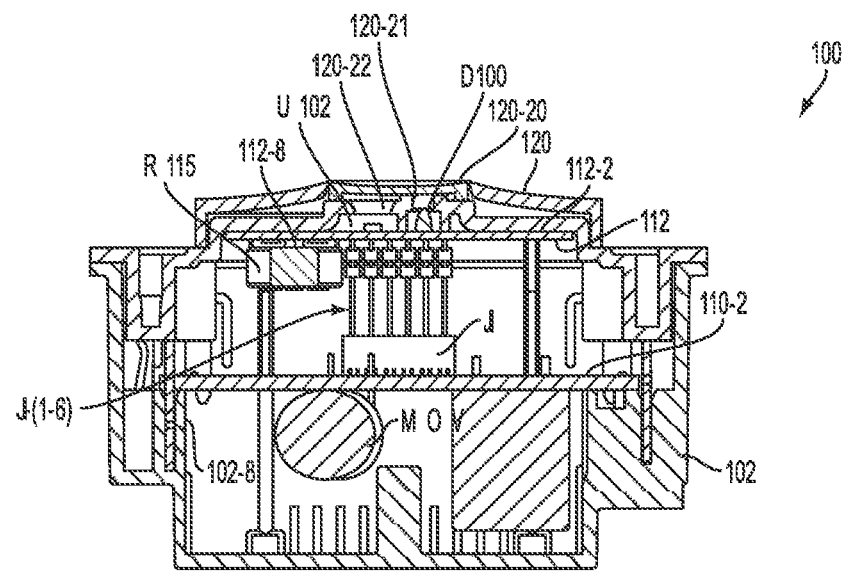
FIGS. 8A-8B are cross-sectional views of the electronic wave switch depicted in FIG. 6.

Referring to FIG. 8A, a latitudinal cross-sectional view of the electronic wave switch depicted in FIG. 6 is disclosed. This view shows more clearly the raised cylindrically shaped plateau 120-20 formed in the enclosure 120-2. Plateau 120-20 is shown to include the LED aperture 120-21 which is aligned with an IR LED (D100) mounted on PCB 112-2. The sensor aperture 120-22 is also shown as being aligned with the sensor integrated chip (IC) U102. The sensor adjustor 112-80 is shown as being coupled to a potentiometer 112-8 (See also R115 in FIG. 11A). The AC power PCB 110-2 includes connector J1 mounted on the top surface thereof. The connector J1 is shown to provide signal connectivity to the actuator circuit PCB 112-2 via lines J1(1-6).

Figure 8B:
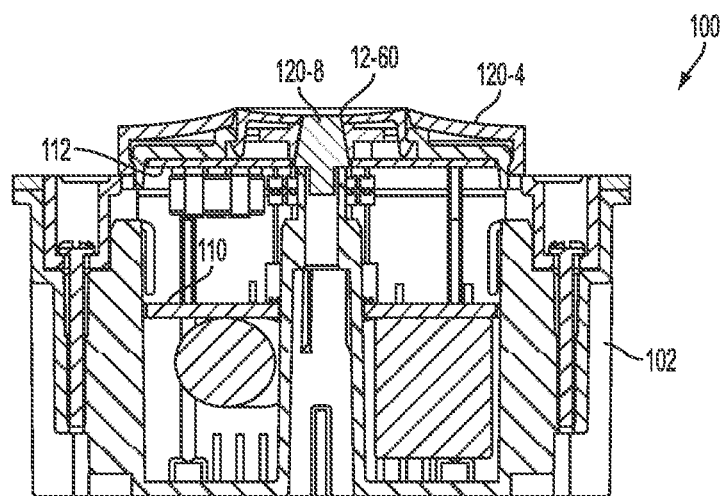

Referring to FIG. 8B, a longitudinal cross-sectional view of the electronic wave switch depicted in FIG. 6 is disclosed. In this sectional view, the aesthetic cover 120-4 and the locator LED light pipe element 120-8 are shown. As described below, the LED light pipe 120-8 directs light from an LED light source that is inserted from the rear of the device 100.

Figure 9:
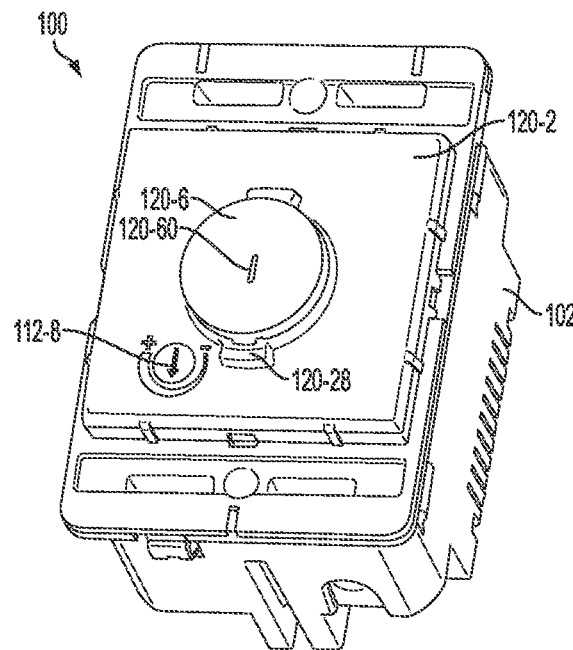
FIGS. 9A-9G are detail views of the cover assembly of the electronic wave switch depicted in FIG. 6.
Figure 9:
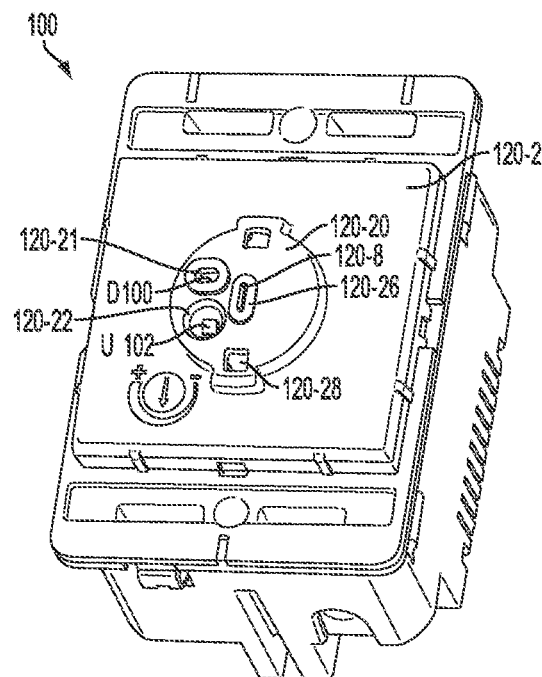
Figure 9:
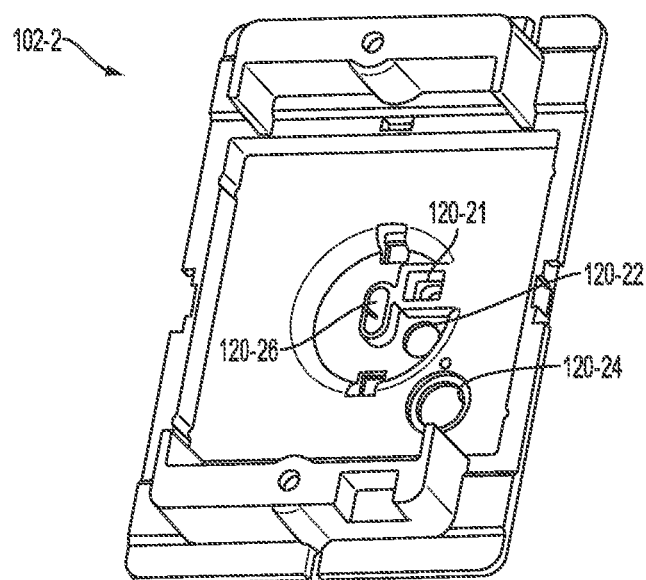
Figure 9:
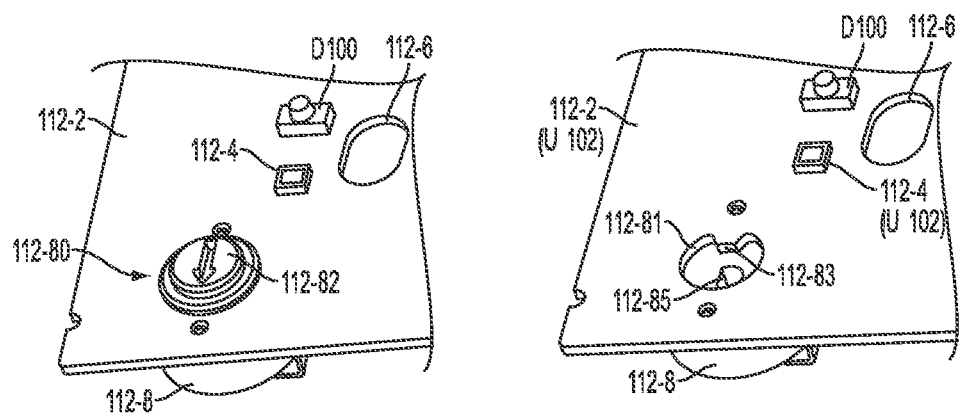
Figure 9:
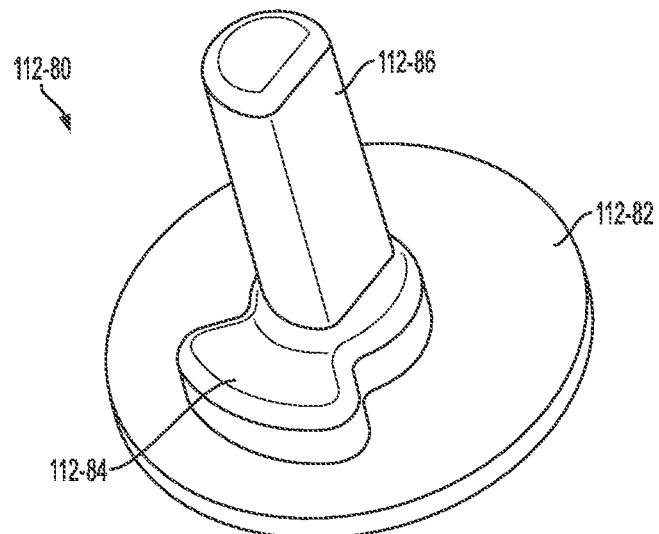
Figure 9:
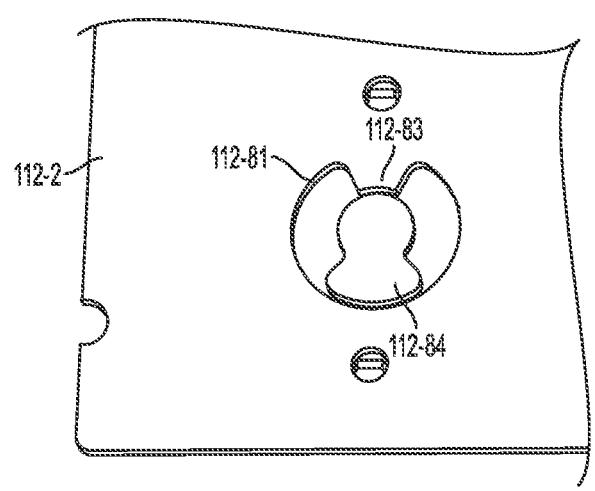

FIGS. 9A-9G are detail views of the cover assembly of the electronic wave switch depicted in FIG. 6. In FIG. 9A, the front aesthetic cover 120-4 removed and the IR lens 120-6 is shown as being disposed over the cylindrically shaped plateau 120-20 portion of the enclosure 120-2. In FIG. 9B, the IR lens 120-6 is removed from overtop plateau 120-20 to reveal the oblong aperture 120-26 that accommodates the light pipe 120-8. This view also shows the LED aperture 120-21 with the IR LED (D100) there within. The sensor aperture 120-22 is also shown visibly aligned with the sensor integrated chip (IC) U102. Finally, the snap-holes 120-28 are shown at either end of the cylindrical portion 120-20. As noted above, the snap holes 120-28 accommodate the snaps 120-62 for the IR lens cap 120-6.

In reference to FIG. 9C, an underside of the enclosure cover 102-2 is depicted to illustrate the optical isolation between the locator light LED 118, the LED D100 and the sensor 112-4 (U102). The size of the LED aperture 120-21 encloses and isolates the IR LED D100 from the other components. The IR LED aperture 120-21 also prevents the infrared light that is emitted from the LED D100 from interfering with the IR Sensor 112-4 (U102). Stated differently, LED aperture 120-21 allows the LED light to be emitted into the ambient space around the device 100, but it also prevents IR light from bleeding through the plastic in enclosure 102-2 to inadvertently cause the IR Sensor 112-4 to actuate the switch. On the other hand, the sensor opening 120-22 is also important. If the opening size is too small, the amount of reflected light is limited such that the amount of light directed to the sensor is not sufficient to effect a desired switch actuation (hand wave). If the opening is too large, internal IR light may be reflected by the lens 120-60 and inadvertently actuate the switch. In sum, the opening 120-22 maximizes the sensor viewing angle of the sensor 112-4 to optimize its ability to sense reflected IR light (i.e., from a hand wave).

Referring to FIG. 9D, a detail view of the sensor adjustor 120-80 disposed on PCB 112-2 is disclosed. In this view, the sensor adjustor 112-80 is shown on one side of the low voltage PCB 112-2 with the potentiometer 112-8 being disposed on the other. The sensor adjustor 112-80 includes an adjustor dial 112-82 that provides the user with means to rotate the sensor adjustor 112-80 when adjusting the sensor sensitivity. FIG. 9E is a detail view that shows the PCB 112-2 with the sensor adjustor 120-80 removed to reveal the sensor adjustment aperture 112-81 (which accommodates the sensor adjustor 112-80). The sensor adjustment aperture 112-81 includes a limiter portion 112-83 that prevents the sensor adjustor 112-80 from being over-rotated (such that potentiometer 112-8 is damaged). The potentiometer 112-8 is shown to include a keyed opening 112-85 for a longitudinal portion of the sensor adjustor 112-80 (i.e., adjustment key 112-86 shown in FIG. 9F).

FIG. 9F is a rear detail view of the sensor adjustor 112-80. The underside of the adjustor dial 112-82 has adjustment key 112-86 extending therefrom. The adjustment key 112-86 is formed by a substantially cylindrical member having a flat surface formed in one side thereof. The keyed shape mates with the keyed opening 112-85 formed within the potentiometer 112-8. Thus, when the dial 112-82 is rotated by a user, the key 112-86 and the keyed opening 112-85 move together to adjust the potentiometer 112-8. The base of the adjustment key 112-86 includes an adjustment stop member 112-84. As shown in FIG. 9G, the adjustment stop member 112-84 is configured to engages the limiter portion 112-83 formed in the sensor adjustment aperture 112-81. As alluded to above, when the stop member 112-84 engages either side of the limiter portion 112-83, the user is thus prevented from over-rotating the sensor adjustor 112-80.

Figure 10A:
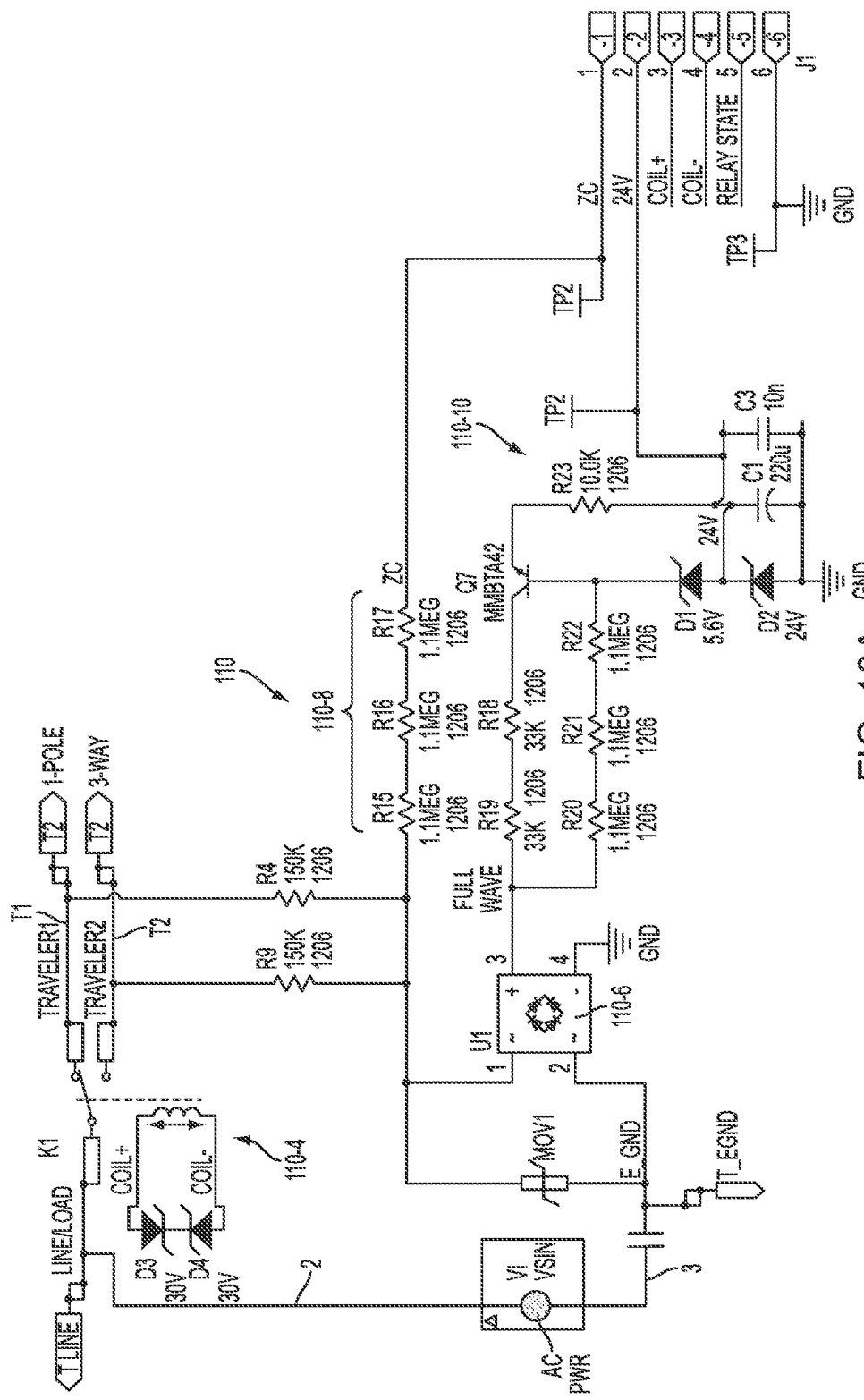
FIGS. 10A-10B are schematic diagrams of the AC power PCB in accordance with the present invention.

As embodied herein and depicted in FIG. 10A, a schematic diagram of the AC power circuit 110 in accordance with the present invention is disclosed. As an initial point, the AC power schematic of FIG. 10 shows that the present invention may be used to realize a three-way switch that can be used to control a light from two (or more) locations in an AC branch circuit. The terminals are labeled as T-line, 1-Pole, 3-Way, and Ground. T-line may be connected to line or load; and 1-Pole may be connected to load or line. The ground terminal (i.e., T_EGND) may be implemented by a ground clip terminal 104 (See, e.g., FIG. 7) that engages the frame 10 (See, e.g., FIGS. 1-5). The frame 10, of course, includes ground wire 10-9 (See, e.g., FIGS. 4A-B) which is connected to the premise ground.

Figure 11B:
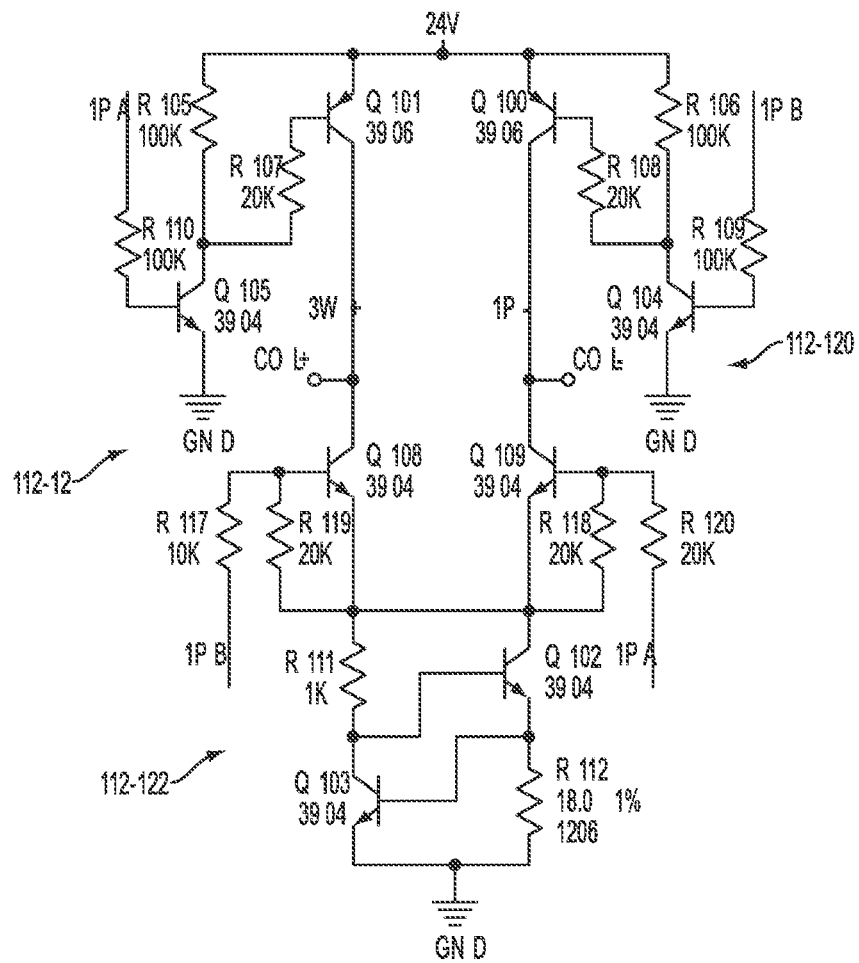

In FIG. 10A, the terminal T-Line is shown as being connected to AC power provided via an upstream circuit breaker AC PWR. The AC branch circuit, of course, provides a line conductor 2 and a neutral conductor 3. The break in the neutral conductor 3 in FIG. 10A indicates that it is connected to ground at the breaker box. The terminal T-EGND is connected to premise ground via the frame 10 as previously described. The terminal T-line is coupled to two traveler conductors T1 and T2 by way of a relay 110-4. A positive pulse on signal line "coil+" will throw the relay switch to traveler T1 whereas a positive pulse on signal line "coil−" will throw the relay switch to traveler T2 (The relay coil actuation circuit is shown at FIG. 11B). As noted previously, the terminal T-Line can be connected to a load (e.g., a light element); the load would, of course, be connected to a neutral conductor that extends back to the circuit breaker CB to complete the circuit.

Figure 10B:
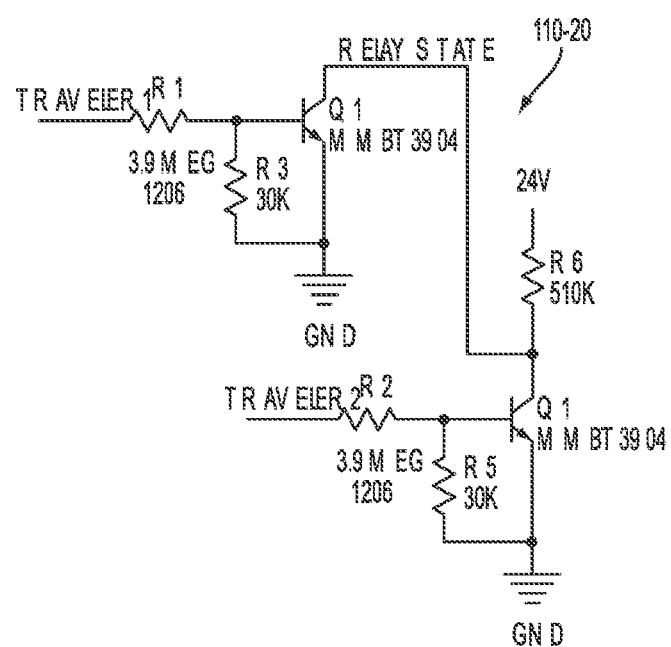

In any event, both the first traveler T1 and the second traveler T2 are connected to the power bridge circuit 110-6, a scaling circuit 110-8 and the calibration circuit 110-20 (See FIG. 10B). The bridge circuit 110-6, of course, provides full wave rectified power to the power supply circuit 110-10 and is always coupled to AC power via resistor R9 or resistor R4. The scaling circuit 10-8 is configured to provide a current limited signal to the zero cross input (ZC) of connector jack J1. As explained below, a processor on the low voltage PCB 112-2 uses the zero cross information for signal timing purposes.

The power supply circuit 110-10 includes transistor Q7 which provides a current limited source to charge capacitor C1 to about 24 VDC. The 24 VDC is provided to power the coil actuator circuit in FIG. 11B. Diode D1 clamps the voltage across R23 to limit the charging current to about 0.5 mA or less. An unlimited current would damage the circuit during a start-up or charging event. Also since the power supply circuit leaks current from either line powered conductor T1 or T2 to earth, it is important to limit this current to minimize the effect on upstream devices that are sensitive to earth leakage, such as GFCIs. As alluded to above, when a neutral conductor 3 is present in the device box, the power supply 110-10 may derive power between the traveler conductor T1 (or T2) to neutral, instead of to earth ground.

In reference to FIG. 10B, the relay state calibration circuit 110-20 is a NOR circuit that is used to calibrate the electronics (FIG. 11A) to switch relay 110-4. Stated differently, the purpose of the relay state calibration circuit is to prevent contact welding by assuring that any switch bounce at relay contact closure occurs at or near the "zero crossing." The output of the calibration circuit ("relay state") is a logic one (high) only when the relay switch 110-4 is between the T1 and T2 contacts. Thus, the relay state output is monitored by the processor on the low voltage PCB to measure the time it is a logic one since this is the time it takes for the relay switch element to move from the traveler T1 contact to the traveler T2 contact (and vice-versa). As explained in more detail below, this value is stored in EEPROM and used during relay switching. This feature allows the processor to time the relay switch command such that the relay switch element strikes the traveler contact (T1 or T2) at precisely the zero crossing of the AC waveform. At the zero cross moment, there is no current flowing through the Line/load conductor given a resistive load, and thus, there will be no arcing as the traveler contact is engaged by the switch relay contact. As a result, the life of the relay contacts is significantly extended. Moreover, the size of the relay can be significantly reduced. This feature yields an efficient design because it lowers component costs and requires less space.

Figure 11C:
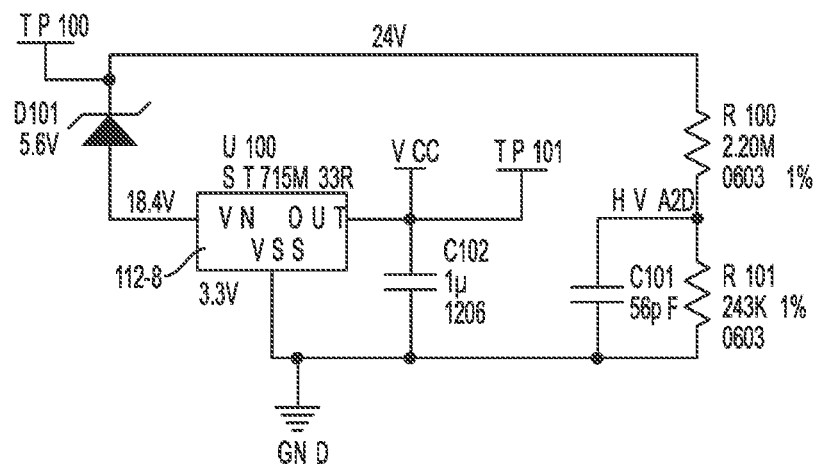

As embodied herein and depicted in FIGS. 11A-11D, schematic diagrams of the low voltage PCB depicted in FIG. 7 are disclosed. In FIG. 11A, the various signals from the AC power PCB 110 are provided to the sensor 112-4 and the processor 112-6 via the connector jack J100 which is coupled to the connector jack J1 disposed on the AC power PCB 110. For example, the +24 VDC signal is provided to the voltage regulator 112-8 (See FIG. 11C). As shown in FIG. 11C, the voltage regulator circuit 112-8 (i.e., U100) is a load drop out regulator that creates a lower DC voltage (3.3 VDC) for the processor 112-6. The regulator 112-8 itself is configured to consistently draw 30 uA. In reference to the signal HV_A2D, it is the output of the circuit formed by resistors R100 and R101, and capacitor C101. This circuit measures the bulk supply provided by the regulator 112-8.

Referring back to FIG. 11A, the processor 112-6 (see also 113-6 in FIG. 16, and 114-6 in FIG. 20) may be implemented using a "ATtiny 24A" processor as shown in the accompanying drawings. The processor includes 2K of flash memory. This IC includes twelve general purpose I/O pins. Pin 1 is connected to VCC, which is provided by the voltage regulator 112-8. Lower voltage processors that use 3.3 VDC (compared to 5 VDC) use less power. The processor 112-6 draws approximately 4-6 uA when it is "asleep." Its current draw when "awake" is about 1-2 mA. The internal clock oscillator of the processor 112-6 runs at 20 MHz. In an alternate embodiment, the internal oscillator runs at 20/8 Mhz. The reason for selecting the oscillator frequency relates to power tradeoff: the lower frequency causes less current draw but the instructions take longer to execute.

It will be apparent to those of ordinary skill in the pertinent art that modifications and variations can be made to the processor (112-6, 113-6, or 114-6 shown in the various embodiments of the present invention) depending on a variety of factors including cost, power and speed. In addition, the selected processor must perform the core functions of the present invention. Many of the pins on the left side of the processor 112-6 are used to interface the switch or switch sensor, depending on the embodiment. Pins 4, 7 and 8 are factory programming pins that provide reset, MOSI ("master out slave in") and MISO ("Master in slave out"), respectively. The zero cross (ZC) signal and the RELAY STATE signals are provided to pin 5 and pin 12, respectively, of the processor 112-6. As noted above, these signals are used to control the timing of the relay switch actuation. The output signal HV_A2D is provided to the analog to digital input of the processor 112-6. Thus, the processor 112-6 monitors the bulk supply and locks out switch actuations that are below a certain voltage. This feature ensures that the relay switch closure times are consistent. The signal 1PB is provided to the relay switch actuation circuit (FIG. 11B). It has a normally low output, and is driven HIGH for 10 milliseconds to actuate the relay switch solenoid. The signal 1PA also has a normally low output, and it is also driven HIGH for 10 milliseconds to actuate the reverse solenoid current.

The sensor 112-4 (U102) is an active sensor that is powered by the micro-controller 112-6 output (VCC U102). The processor keeps the sensor 112-4 OFF during power-up to speed the charging of C1 (the 220 uF capacitor.) on the AC power board 110. When the sensor is operational, it turns D100 ON for a short amount of time. The sensor 112-4 (U102) is coupled to the infrared (IR) LED D100 which is mounted on the PCB 112-2 adjacent to sensor 112-4. In operation, the IR LED D100 emits infrared light at a predetermined frequency. The sensor includes an integral photo-sensitive element that is configured to receive reflected IR light. When a person waves his hand or some other object in proximity to the LED D100, the emitted infrared light is reflected back toward the photo-sensitive element integrally formed in the sensor 112-4. When the reflected light is received by the sensor 112-4, it is detected by the sensor as being reflected light based on its frequency. However, ambient infrared light that has different frequency characteristics is ignored by the sensor since the photosensitive element is attuned to light having a certain frequency (i.e., a unique signature). In any event, when this detection occurs, the signal /INT on pin 7 of the sensor 112-4 goes LOW. This signal (/INT) interrupts the processor 112-6, which interprets the interrupt as a command to actuate the switch relay. Note that the mechanical structure of the wave switch actuator assembly 120 and its constituent parts prevents cross-talk in multi-gang installations.

The present invention is configured to substantially prevent such cross-talk by way of other means. For example, the sensitivity control described above allows the user to adjust the sensitivity of a switch as needed. When used alone, the wave switch 100 of the present invention can be set to detect motions that are relatively far away from the sensor 112-4. When two or more wave switches are disposed in a multi-gang array, the wave switch 100 can be set to detect motions that are substantially proximate the sensor 112-4 to prevent unintentional actuations of adjacent wave switches. The sensitivity adjustments are accomplished by adjusting the potentiometer 112-8 setting. The potentiometer is coupled to the MISO input of the processor 112-6 which reads the potentiometer setting and provides a corresponding sensitivity setting to sensor 112-4 by way of the MOSI pin. In an alternate embodiment, an individual wave switch can be equipped with LEDs and sensors that are tuned to different duty cycles (i.e., ON and OFF times of D100).

As noted above (FIG. 10B), the purpose of the relay state calibration circuit is to prevent contact welding by ensuring that any switch bounce at closure occurs at or near the zero crossings (or at any predetermined point in the AC cycle). The processor 112-6 performs an automated calibration sequence to achieve this purpose. As explained above, the relay state circuit 110-20 monitors the two travelers and determines when the two switch positions are open at the same time. This of course only happens when the commutator (moveable) contact is between the T1 and T2 contacts. The relay state circuit 110-20 output goes high when the two switch positions are low (NOR gate function). The processor 112-6 thus measures the commutator period, i.e., the time it takes for the commutator to move from the T1 contact to the T2 contact (or vice-versa). The processor 112-6 is also configured to measure the relay switch contact bounce time and store the time interval (i.e., the commutator period as measured from commutator start transit until the last bounce concludes) as a single constant. Alternatively, the processor could store the transit time and bounce time as two distinct constants. The automated calibration sequence can be performed during production or during each operation of the switch by the user, or both. If the automated calibration sequence is performed during production, the relay switch is connected to a pure DC voltage source and the switch is toggled four or five times. Once the constants, have been measured, they are loaded into EEPROM memory. After the switch is sold and connected to AC power, the solenoid is pulsed relative to the zero cross (ZC) in accordance with the constants stored in memory. In an alternate embodiment of the present invention, an average or estimated commutator transit time can be pre-stored in memory. The average or estimated commutator period may be obtained from the relay switch manufacturer or from testing a number of relay switches to obtain an average number.

Turning to FIG. 11B, the current source relay switch actuation circuit 112-12 provides the relay switch output signals (COIL+, COIL-) in accordance with the inputs signals 1PA and 1PB provided by the processor 112-6. The relay switch actuation circuit 112-12 includes an "H-bridge" circuit 112-120 and a constant current sink 112-122. The H-bridge circuit 112-120 includes transistors Q100, Q101, Q108 and Q109. The output COIL+ is disposed at the common collector node between Q101 and Q108. The output COIL- is disposed at the common collector node between Q100 and Q109. These outputs are provided to the relay solenoid coil via jack 100.

The input 1PA is provided by the processor 112-6 and is coupled to the bases of the transistors Q105 and Q109, respectively. The transistor Q105 is part of an inverter stage that is coupled to H-bridge transistor Q101. The other input, 1PB, is coupled to the bases of input transistors Q108 and Q104, respectively. Transistor Q104 is also part of an inverter circuit, and is coupled to H-bridge transistor Q109. The purpose of the inverters is described in greater detail below. The emitters of transistors Q108 and Q109 are connected to the constant current sink 112-122. Taken together, these circuits provide the relay switch 110-4 with a constant current source.

The operation of the constant current source is as follows. The processor controlled signals 1PB and 1PA are never ON at the same time. When the processor drives the input control signal 1PA HIGH, the relay commutator is driven in one direction, and when it drives 1PB HIGH, the commutator is driven in the opposite direction. Thus, only one operation (1PA or 1PB) of the constant current source (112-20, 112-22) need be described. When 1PA is driven HIGH, transistors Q109 and Q105 are turned ON because they are NPN transistors. Q105 is an inverter which drives the base of transistor Q101 LOW. Since Q101 is a PNP transistor, it is turned ON. As a result, current flows from the +24 V supply and into the COIL+ input of the relay 110-4 via transistor Q101. The current returns to the H-bridge circuit 112-20 via the node COIL− and flows through Q109 to the constant current sink circuit 112-122.

At this point, the current flows through resistor R111 to the base of transistor Q102, turning it ON, such that current flows through resistor R112. When the voltage across resistor R112 reaches a predetermined threshold (e.g., about 0.6-0.7 V) the transistor Q103 also turns ON to divert current away from the base of transistor Q102 such that the voltage across R112 is substantially constant. Stated differently, the resistor R112 controls the constant current source by maintaining the current flow through Q102. The constant current sink 112-22 thus regulates the current flowing through the relay switch 110-4 (via output nodes COIL+, COIL−). Again, the constant current source 112-12 is employed to obtain consistent commutator periods (commutator transit times between T1 and T2). Again the constant current sink 112-22 works in the same manner for both the 1PA and the 1PB actuations.

The consistent commutator periods hold true even if the switch is actuated by the user in rapid succession, e.g. once a second. Using the tap switch embodiment (FIGS. 12-16) as an example, any user input from S100 (FIG. 16) will yield a predictable sequence. The level of constant current multiplied by the solenoid impedance yields 12 VDC. Thus, the constant current source discharges C1 to not less than 12 VDC during the 10 millisecond pulse interval while, at the same time, the current remains constant.

In an alternate embodiment, the constant current source may be eliminated by locking out user switch actuations to less than, e.g., 2 second intervals. In this embodiment, the relay would always be energized via decaying exponential voltage starting at 24 VDC. In yet another alternate embodiment that can be employed with inductive loads, the processor is configured to close the relay at the optimum phase angle for the anticipated inductive or capacitive loads. Thus, the automated calibration would take the load phase shift into account.

Figure 11D:
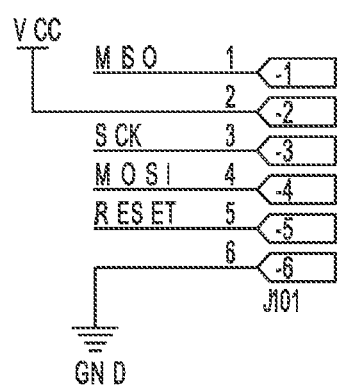

In reference to FIG. 11D, the processor can be programmed using signals MISO, MOSI which are present on jack J101.

Figure 12A:
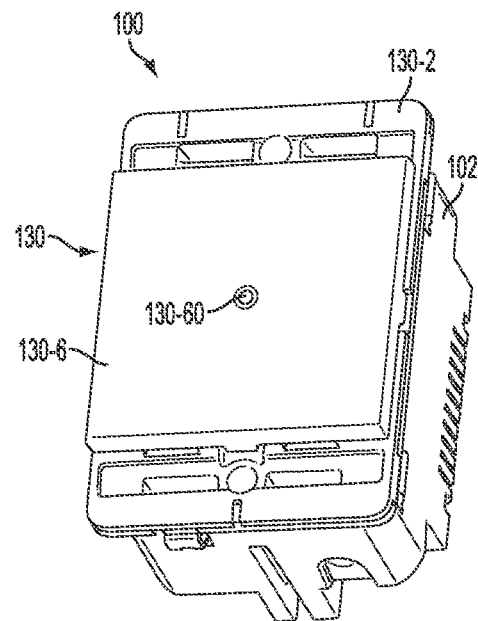
FIGS. 12A-12B are perspective views of an electronic tap switch in accordance with another embodiment of the present invention.
Figure 12B:
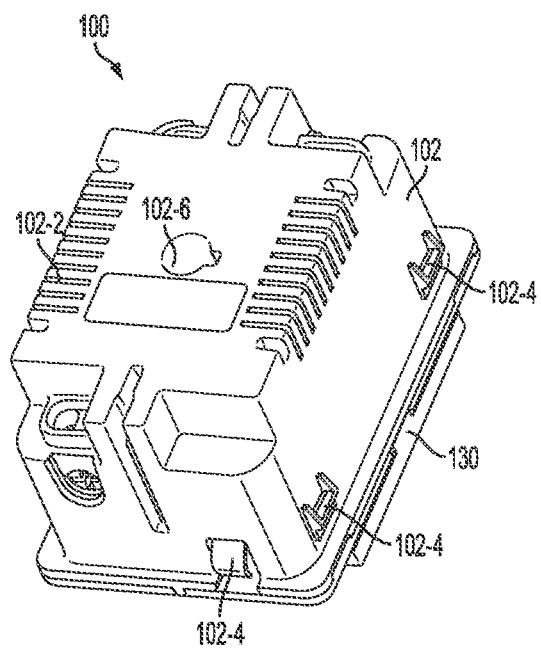

As embodied herein and depicted in FIGS. 12A-12B, perspective views of an electronic tap switch 100 in accordance with another embodiment of the present invention is disclosed. FIG. 12A shows a top perspective view of the tap switch 100. The tap switch device 100 includes tap switch cover assembly 130 coupled to the back body member 102. The top layer of the cover assembly 130 is the changeable decorative cover 130-6 which snaps into the functional actuator 130-4 (not shown) using snaps 130-62. The circular lens 130-60 is a relatively high portion of the cover 130-6 that allows light emitted by the separate LED locator light 118 (not shown in this view) which is configured to transmit light into the ambient environment around the cover assembly 130-6 when the device 100 is installed and energized.

FIG. 12B shows the rear perspective view of the tap switch 100 which shows the back body member 102. The back body 102 is identical to the one shown in FIGS. 6-9. The light tube 102-6 is configured to accommodate the LED locator light 118 (not shown in the view). As noted previously, the LED locator light 118 extends through the center portion of the device 100 via locator light tube 102-6. The center aperture 130-40, of course, accommodates the LED locator light 118 that extends through the tube 102-6. As noted previously, there are corresponding apertures in the AC power PCB 110 and the low power voltage PCBs (112, 113 and 114).

Figure 13A:
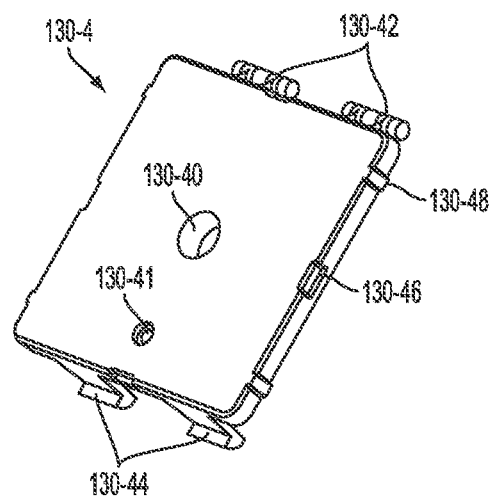
FIGS. 13A-13B are detail views of various layers of the front cover assembly of the electronic tap switch depicted in FIGS. 12A-12B.
Figure 13B:
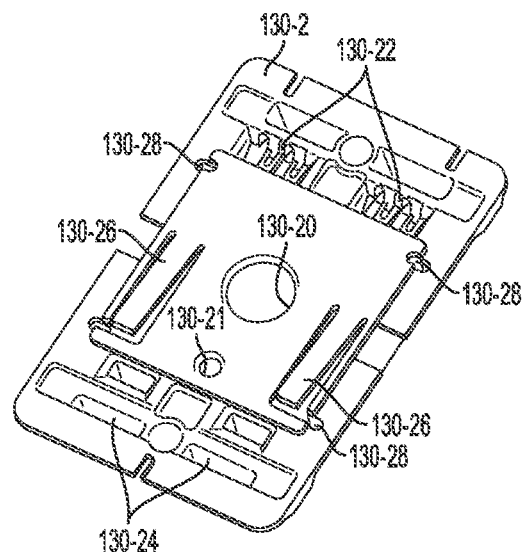
Figure 14:
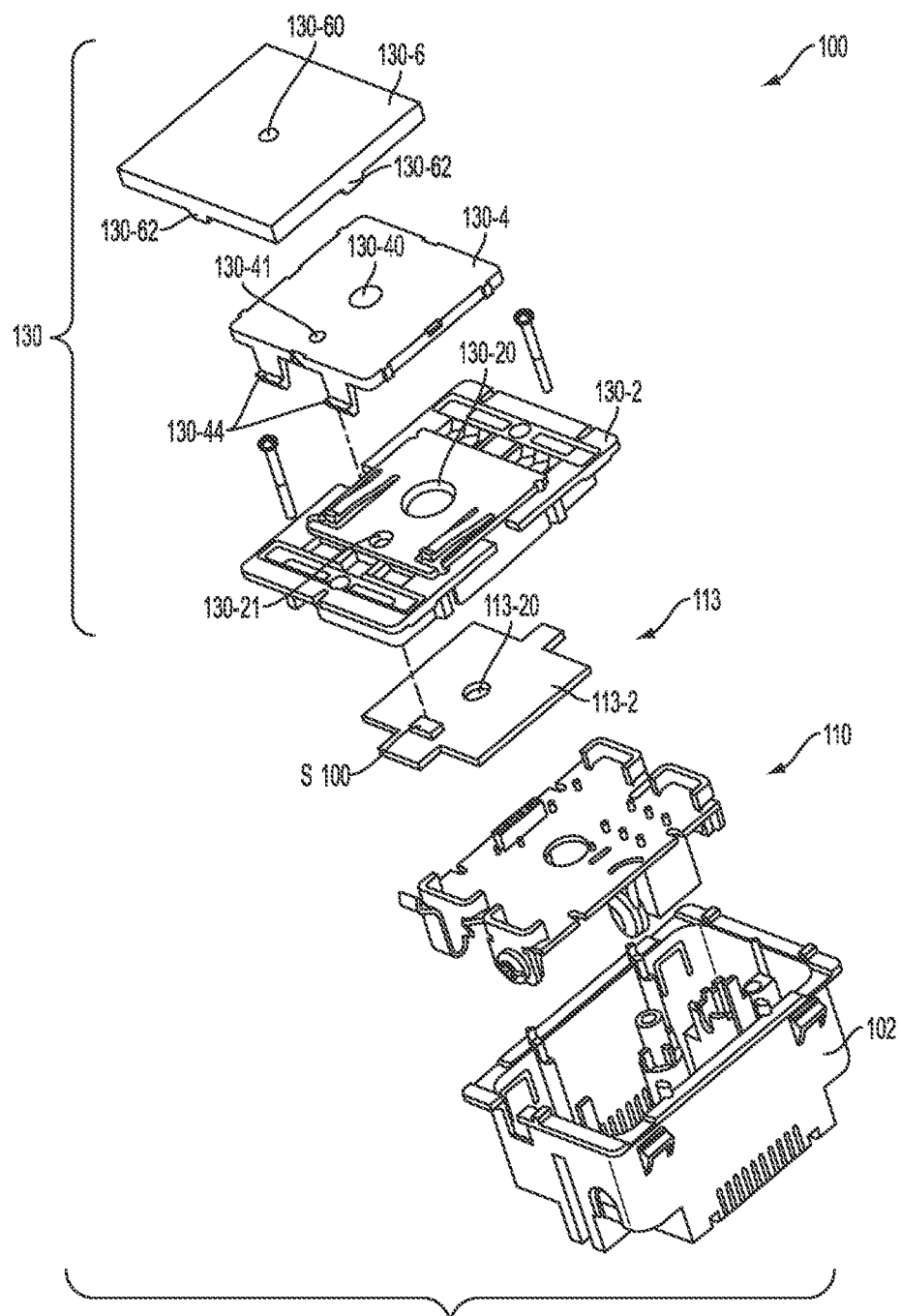
FIG. 14 is an exploded view of the electronic tap switch depicted in FIGS. 12-13.

In reference to FIGS. 13A-13B, detail views of the tap switch functional actuator 130-4 and the enclosure 130-2 are more clearly depicted. The functional actuator 130-4 includes slidable snaps 130-44 that are configured to snap into apertures 130-24 of enclosure layer 130-2 (See FIG. 13B). At the opposite end, the functional actuator 130-4 includes hinge elements 130-42 which are configured to snap into the hinge receptors 130-22 formed in the enclosure layer 130-2. The functional actuator 130-4 further includes a switch boss 130-41 which is configured to extend through boss aperture 130-21 of the enclosure layer 130-2. The enclosure layer 130-2 further includes leaf spring elements 130-26 which causes the switch boss 130-41 of functional actuator 130-4 to disengage from the tap switch S100 disposed on the low voltage board 113 (See FIG. 14) after the user has finished depressing the tap switch.

In reference to FIG. 14, an exploded view of the electronic tap switch 100 depicted in FIGS. 12-13 is disclosed. Again, the decorative cover 130-6 snaps into the functional actuator 130-4 using snaps 130-62. A switching axis is shown extending from the switch boss 130-41, through boss aperture 130-21, and to the tap switch S100 disposed on the low voltage tap switch board 113. Taking FIGS. 12-14 together, the functional actuator 130-4 is shown to be fixed at one end by the hinge members (130-24, 130-44) and the switch actuator 130-4 rotates about the hinge axis such that switch boss 130-41 can slidably move within boss aperture 130-21 to actuate the tap switch S100 disposed underneath on the low voltage PCB 113. The low voltage tap switch board 113 receives power from the AC power PCB 110 which is disposed in the back body 102. The same AC power PCB 110 and the same back body 102 are used in the wave switch embodiment (FIGS. 6-9) and the instant embodiment.

Figure 15A:
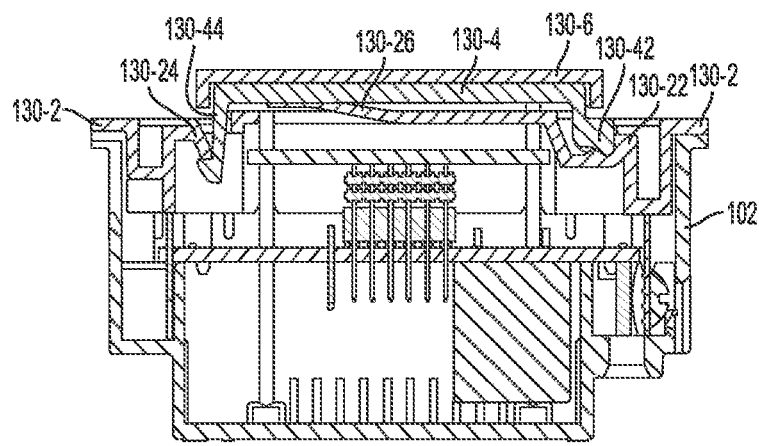
FIGS. 15A-15D are cross sectional views of the electronic tap switch depicted in FIGS. 12A-12B.
Figure 15B:
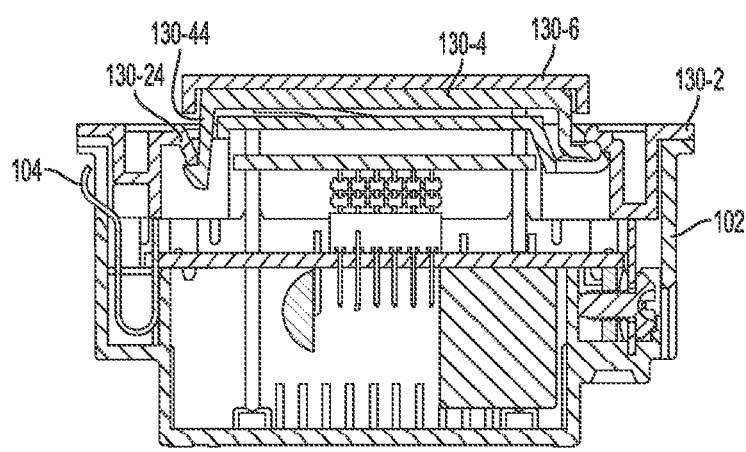

FIGS. 15A-15D are cross sectional views of the electronic tap switch depicted in FIGS. 12-14. FIG. 15A provides a longitudinal cross-sectional view that shows the slidable snap 130-44 disposed in the aperture 130-24. At the opposite end, the hinge 130-42 is shown as being disposed in the hinge receptors 130-22. In the mid-portion in between the ends, the leaf spring 130-26 can be seen supporting the functional actuator 130-4. In FIG. 15B, a second longitudinal cross-sectional view is provided. This view shows the second set of slidable snaps and hinges.

Figure 15C:
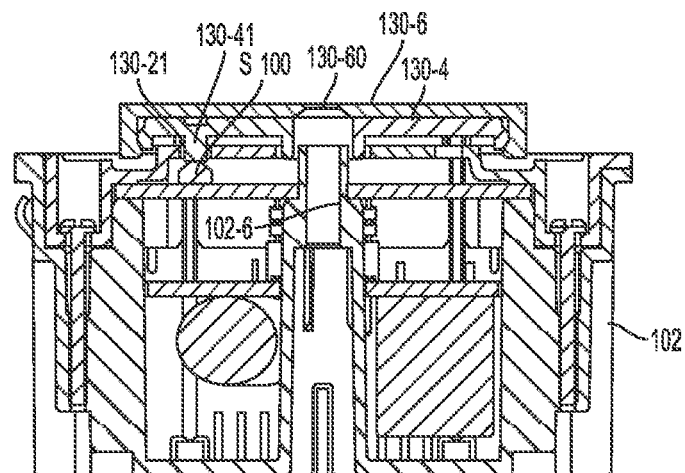

FIG. 15C provides a latitudinal cross-section that extends through the tap switch S100 and the center light tube 102-6. This view illustrates how the switch boss 130-41 extends through boss aperture 130-21 to actuate the electronic switch S100. In addition, the decorative cover 130-6 is shown to include a light window or lens 130-60 formed therein. The lens 130-60 may be mechanically machined or etched out by a laser.

Figure 15D:
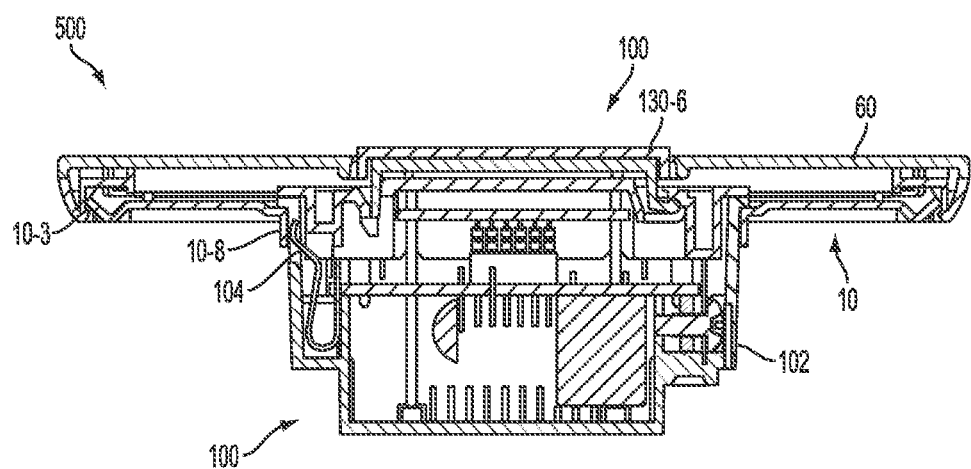

FIG. 15D is another longitudinal cross-section of the tap switch 100. In this view, the tap switch 100 is shown mounted to the frame 10 (FIGS. 1-4). The device box is not shown in this view for clarity of illustration. However, a person having ordinary skill in the art will understand that the back body 102 of the device is housed within the device box. Moreover, as described previously, the frame 10 is coupled to the device box and the device 100 is snapped into the frame 100 such that the various terminals automatically make connection to the connection tabs provided by the frame 10. For example, this view shows the device 100 ground tab 10-8 engaging the ground connection tab 104. Once the device is installed within the frame 10, then the user will connect the aesthetic cover plate 60 to the frame. Each type of aesthetic overlay (60, 60-20 and 60-30) substantially abuts the adjacent wall surface 1 by virtue of a ratcheting overlay snap 10-3.

Figure 16:
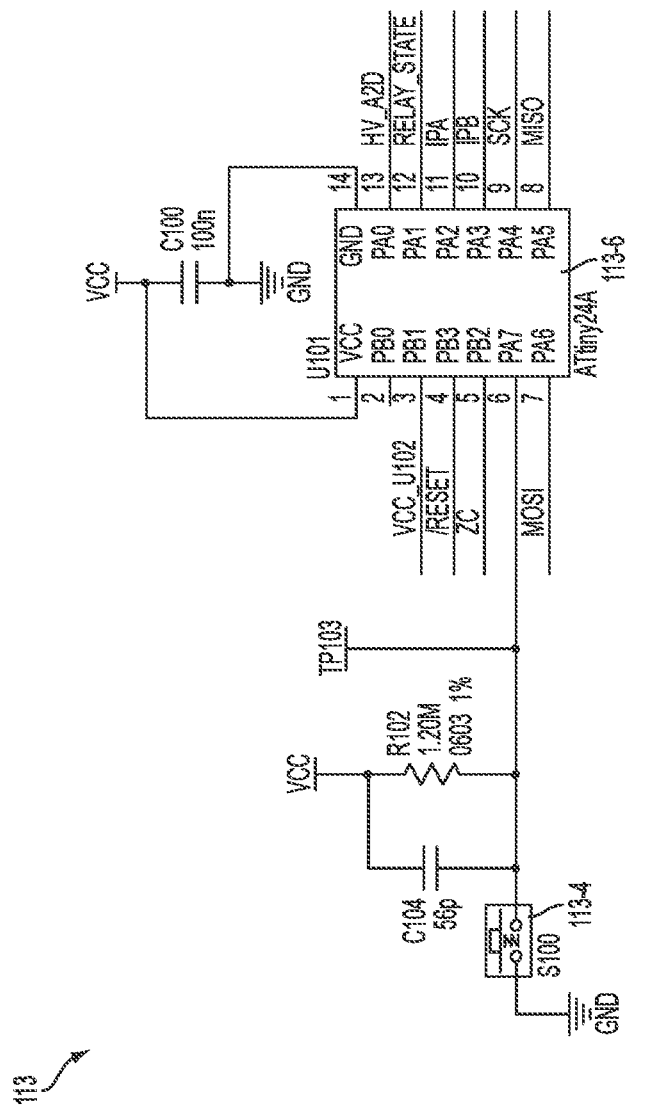
FIG. 16 is a schematic diagram of the low voltage PCB of the electronic tap switch depicted in FIG. 13.

As embodied herein and depicted in FIG. 16, a schematic diagram of relevant portions of the low voltage PCB 113 depicted in FIG. 13 are disclosed. With the exception of the switch 113-4 (S100) and the processor 113-6, this circuit is identical to the one shown in FIG. 11A. Stated differently, the switch 113-4 replaces the sensor 112-4 (in FIG. 11A) and the processor 113-6 replaces the processor 112-6 (in FIG. 11A). While both processors can be implemented using the same hardware, the software may be different since one embodiment responds to sensor actuation and the other embodiment responds to switch actuation. In any event, when the user wishes to change the state of the lighting load, he or she merely taps the decorative plate 130-6 such that the switch button 113-4 (S100) is depressed. The processor reads the interrupt much like it did in the previous embodiment. Once the processor 113-6 senses the interrupt signal it provides the signals 1PA and 1PB to the relay switch actuation circuit 112-12 (See FIG. 11B) in accordance with the timing signals ZC and RELAY STATE as described previously.

Figure 17A:
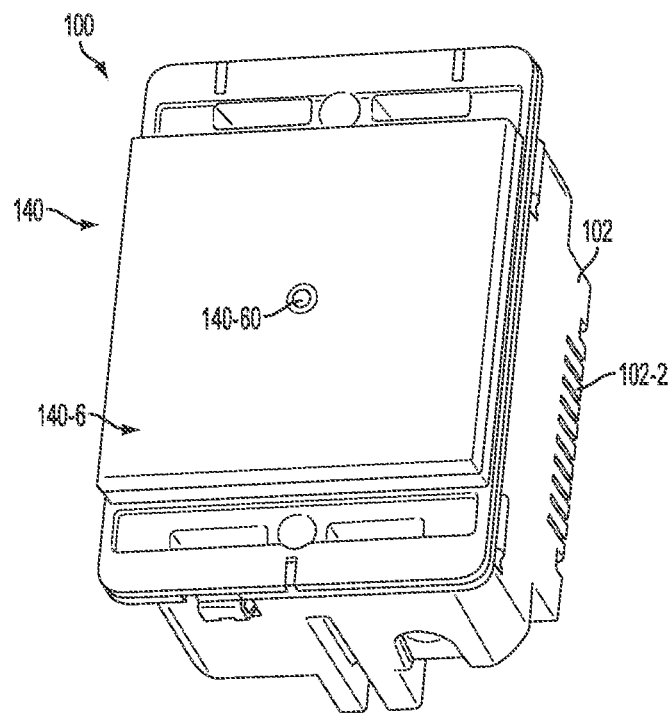
FIGS. 17A-17B are perspective views of an electronic touch switch in accordance with yet another embodiment of the present invention.
Figure 17B:
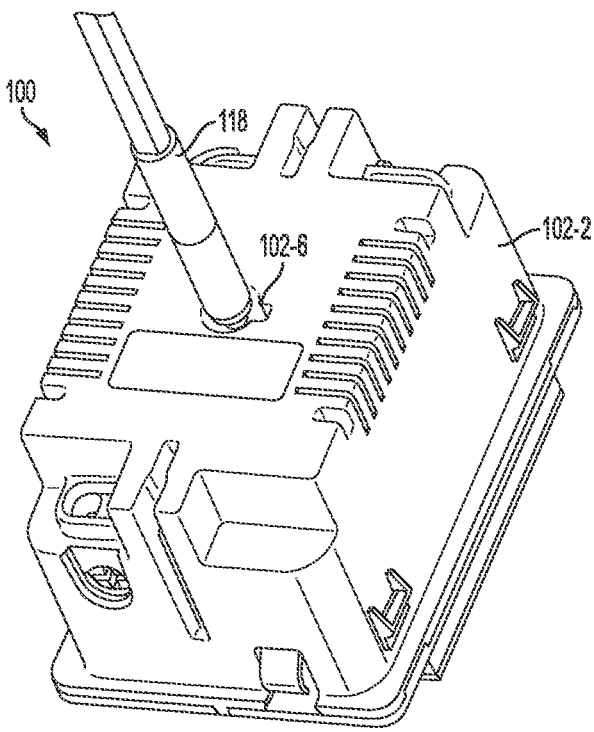

As embodied herein and depicted in FIGS. 17A-17B, perspective views of an electronic touch switch in accordance with yet another embodiment of the present invention is disclosed. FIG. 17A shows a top perspective view of the touch switch 100. The touch switch device 100 includes cosmetic cover assembly 140 coupled to the back body member 102. The top layer of the cover assembly 140 includes a circular lens 140-60 is a relatively thin portion of the cover 140-6 that allows light emitted by the separate LED locator light 118 (not shown in this view) which is configured to transmit light into the ambient environment around the cover 140-6 when the device 100 is installed and energized.

FIG. 17B shows the rear perspective view of the touch switch 100 which features the back body member 102. The back body 102 is identical to the one shown in the previous embodiments. The light tube 102-6 is configured to accommodate the LED locator light 118. As shown herein, the LED locator light 118 extends through the center portion of the device 100 via tube 102-6.

Figure 18:
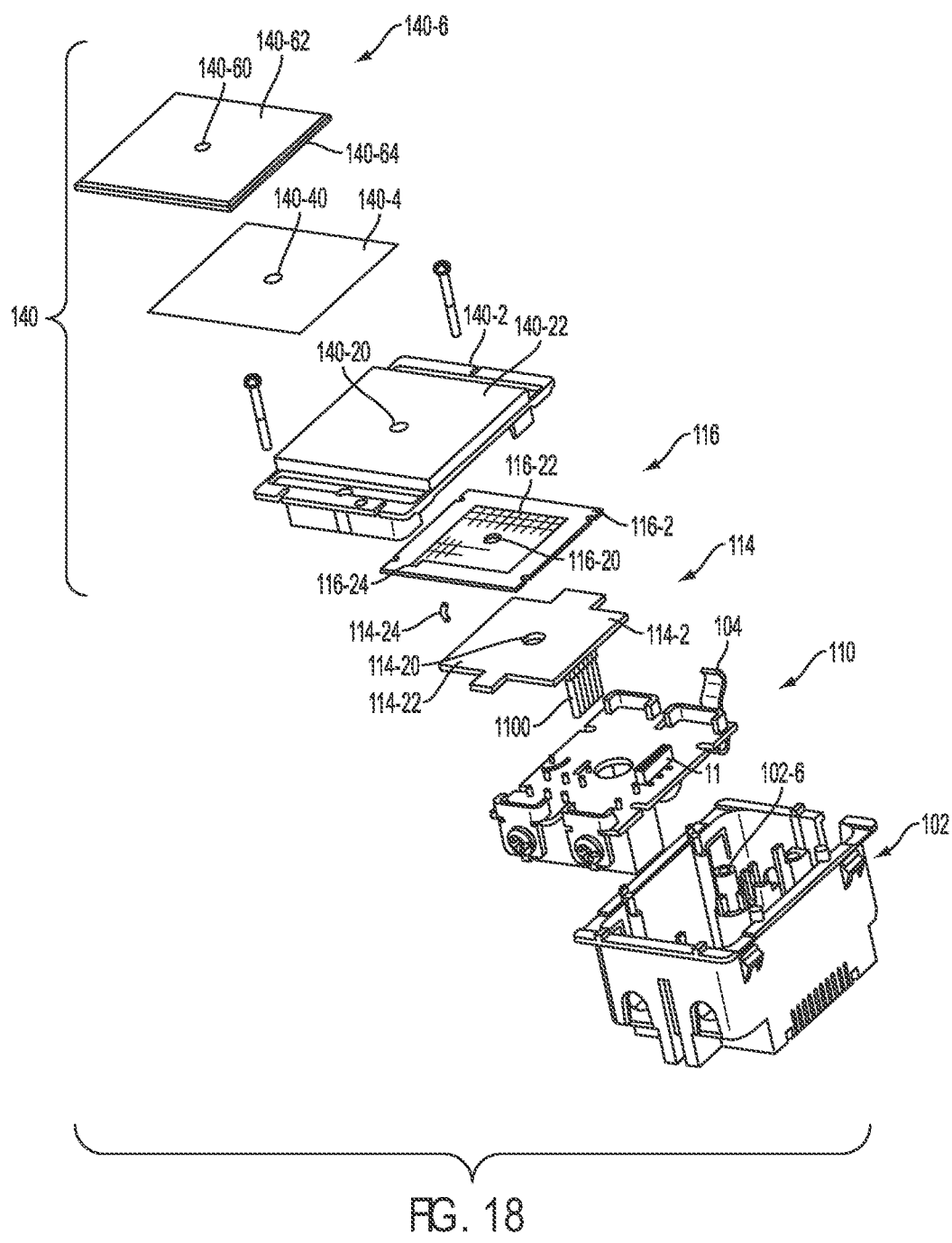
FIG. 18 is an exploded view of the electronic touch switch depicted in FIG. 17A.

Referring to FIG. 18, an exploded view of the electronic touch switch depicted in FIGS. 17A-17B is shown. The cover assembly 140 includes a decorative cover 140-6 that has a clear plastic top layer 140-62 bonded to a colored under layer 140-64. The purpose of this arrangement is to provide the decorative cover with the perception of depth. Again, the lens aperture 140-60 is a narrow region in the center of the cover 140-6. The decorative cover 140-6 is coupled to a major surface 140-22 of the cover enclosure 140-2 by an adhesive layer 140-4. The adhesive layer 140-4 includes a central aperture 140-40 that allows the LED locator light 102-18 to emit light there through. The cover enclosure 140-2 also includes a thin lens region 140-20. The cover enclosure also houses an antenna assembly 116 that includes an antenna 116-22 disposed on a printed circuit board 116-2. The antenna 116-22 is coupled to a via 116-24 which couples the antenna 116-22 to the low voltage PCB 114 via an interconnection wire 114-24. Of course, the antenna PCB 116-2 includes a central aperture 116-20 that accommodates the LED locator light 118.

As before, the low voltage signal processing assembly 114 includes a PCB 114-2 that includes a central aperture that accommodates the LED locator light 118. And as before, the low voltage PCB 114-2 is connected to the AC power board 110 by the interconnection of jacks J1 and J100. Moreover, the AC board 110 is identical to the AC PCBs 110 used in the previous embodiments. Finally, like the previous two embodiments, the AC PCB 110 and the low voltage PCB 114-2 are housed within the back body member 102.

Figure 19:
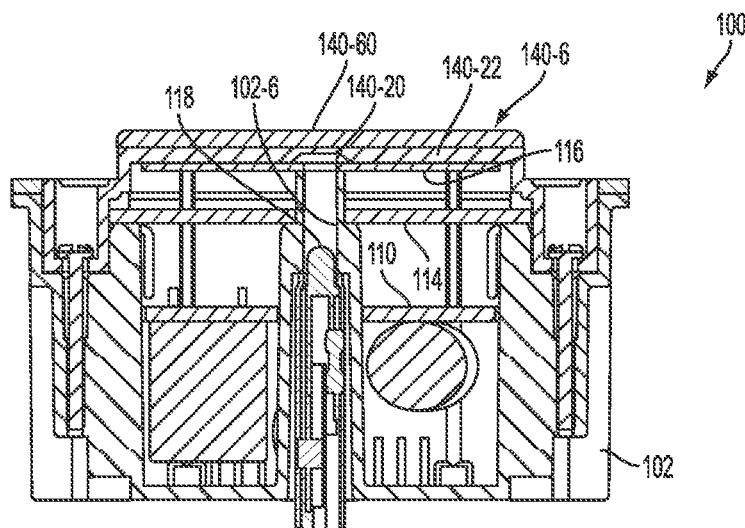
FIGS. 19A-19C are cross sectional views of the electronic touch switch depicted in FIGS. 17A-17B.
Figure 19:
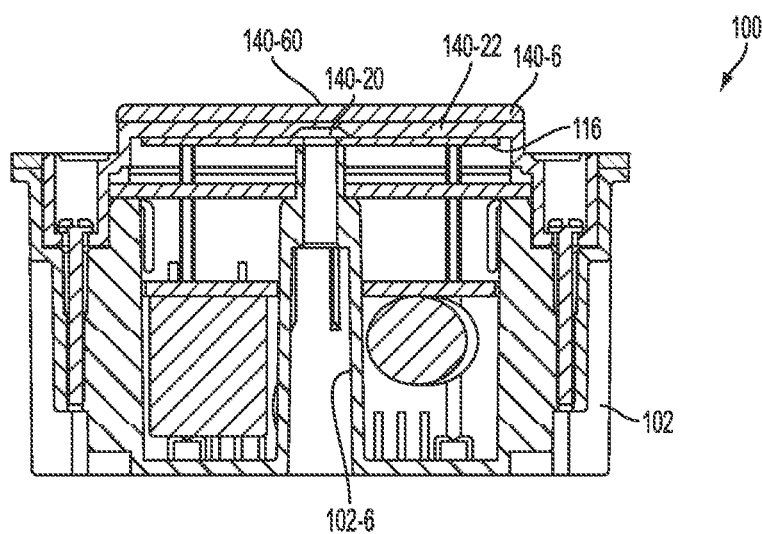
Figure 19:
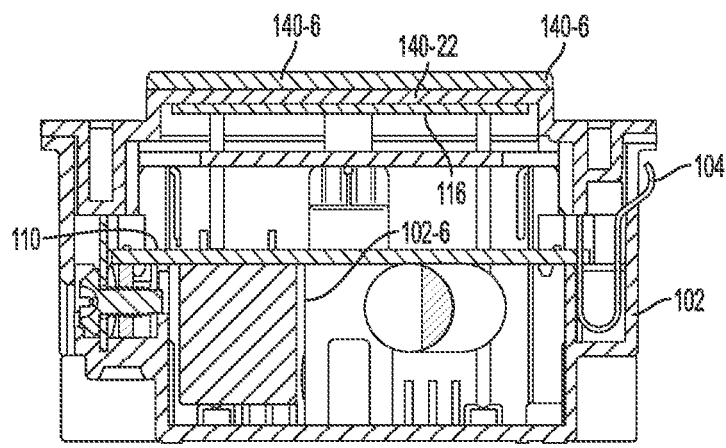

Referring to FIGS. 19A-19C, cross sectional views of the electronic touch switch 100 depicted in FIGS. 17-18 are disclosed. FIGS. 19A and 19B are directed to longitudinal cross-sectional views of the touch switch 100. FIG. 19A shows the switch with the LED locator light 118 inserted into the tube 102-6 whereas FIG. 19B shows the locator light 118 removed from the tube 102-6. This view shows all of the lenses (140-20, 140-60) in alignment. FIG. 19C is another longitudinal cross-sectional view of the touch switch 100. This view shows the ground terminal 104 accessible from the back body 102. As explained above, the ground terminal 104 is a flexible element that is configured to make contact with the frame 10 (which is coupled to premise ground).

Note that the antenna board 116 abuts the underside of the cover enclosure 140-22. As depicted in FIG. 18, the antenna 116-22 is actually a copper grid or mesh disposed on PCB 116-2. The copper mesh implements a "single ended" electrode, or conductor. The copper area creates a capacitance with respect to neighboring grounds; this capacitance is defined as the load capacitance. As explained previously, the copper mesh and PCB is disposed under the cover enclosure 140-2. The load capacitance is typically below about 20 pf since the load capacitance can affect the rise and fall times of the burst patterns generated by the sensor test signal (SNSK). The test signal creates an E-field; and the E-field must be an appropriate distance from ground. This distance is implemented by placing the copper mesh on a separate PCB under the cover enclosure 140-2, and implementing a ground plane about ⅛ inches away on the low voltage PCB 114-2. When a person's finger approaches the actuator, the person's body provides the capacitance that changes the E field. In another embodiment of the invention the ground plane is implemented on the underside of PCB 116-2 made about ⅛ inch thick.

Figure 20:
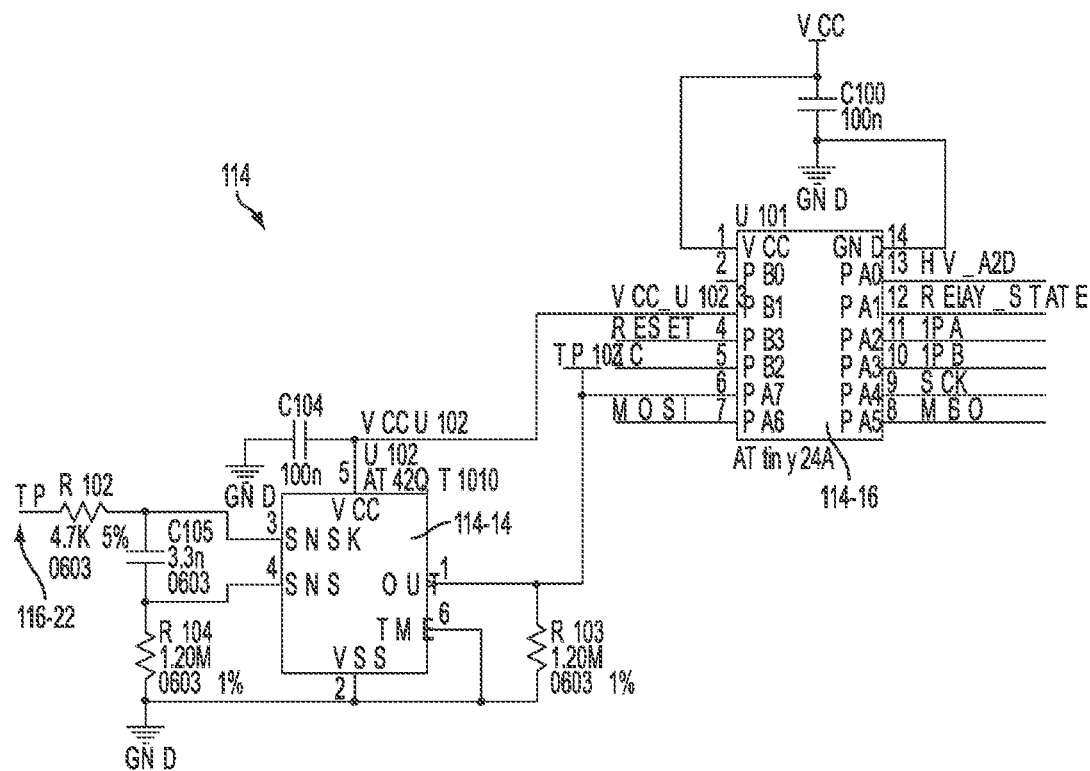
FIG. 20 is a schematic diagram of the low voltage PCB of the electronic tap switch depicted in FIG. 18.

Referring to FIG. 20, a schematic diagram of the low voltage PCB 114 of the electronic touch switch depicted in FIG. 18 is disclosed. Again, only the sensor 114-4 and the processor 114-6 are shown because all of the other components are identical to what is shown in the first embodiment. The sensor 114-4 (U102) is an active sensor that is powered from the processor 114-6 via the "VCC-U102" output. One reason for this arrangement is that the processor 114-6 can remove power from the sensor 114-4 during power-up such that the charging of the +24 VDC power supply output (i.e., capacitor C1 in FIG. 10A) can be expedited. The sensor 114-4 (U102) is coupled to the antenna 116-22 by capacitor C105 and resistor R102. In operation, when a person's finger touches the dielectric plate 140-22, the capacitance changes significantly because the circuit is configured in such a way that the capacitive effects of the finger dominate. When the sensor 114-4 detects the change in capacitance, the sensor OUT (pin 1) goes LOW to provide a signal interrupt to the processor 114-6. As before, the interrupt is interpreted as a command to actuate the switch relay. Once the processor 112-6 senses the interrupt signal it provides the signals 1PA and 1PB to the relay switch actuation circuit (FIG. 11B) in accordance with the timing signals ZC and RELAY STATE as described previously.

In one embodiment of the present invention, the sensor 114-4 is implemented as an integrated circuit chip ("AT42QT1010") manufactured by ATMEL CORPORATION. This IC is a momentary responding device that provides a HIGH output signal when a person's finger is touching or proximate the plate (140-62). Stated differently, SNSK output provides a periodic pulse train at a first frequency ($f_1$) across the measuring capacitor C105. When a human finger touches the plate (140-62) or is close to touching it, the capacitance across capacitor C105 changes such that the signal presented on the OUT pin is a logic HIGH. The processor reads this logic HIGH as an interrupt and a command to switch the relay. Once the finger is no longer touching or proximate the plate, the OUT pin signal is a logic LOW.

In another embodiment, the sensor 114-4 is configured to include a serial data input pin similar to the one employed by sensor 112-2 in FIG. 11A. Much like the previous embodiment, the potentiometer 112-8 (As per FIG. 11A) is connected to the MISO input of processor 114-6. The processor output port (MISO) is connected to the serial data input port of the alternate embodiment sensor 114-4 to thereby provide it with sensitivity adjustment data such that the sensitivity of the capacitive sensor can be adjusted. For example, the user may become annoyed if the switch is actuated when a person, or the person's shoulder inadvertently brushes by the switch. On the other hand, the user may desire to raise the sensitivity when the required touch is too heavy or pronounced.

In an alternate embodiment of the invention, the sensor 114-4 is configured as a latching device. Once the sensor output is driven HIGH, it will remain that way until the user touches the plate again. Thus, the processor is programmed to switch the relay when transitions occur (LOW to HIGH, or HIGH to LOW).

Figure 21:
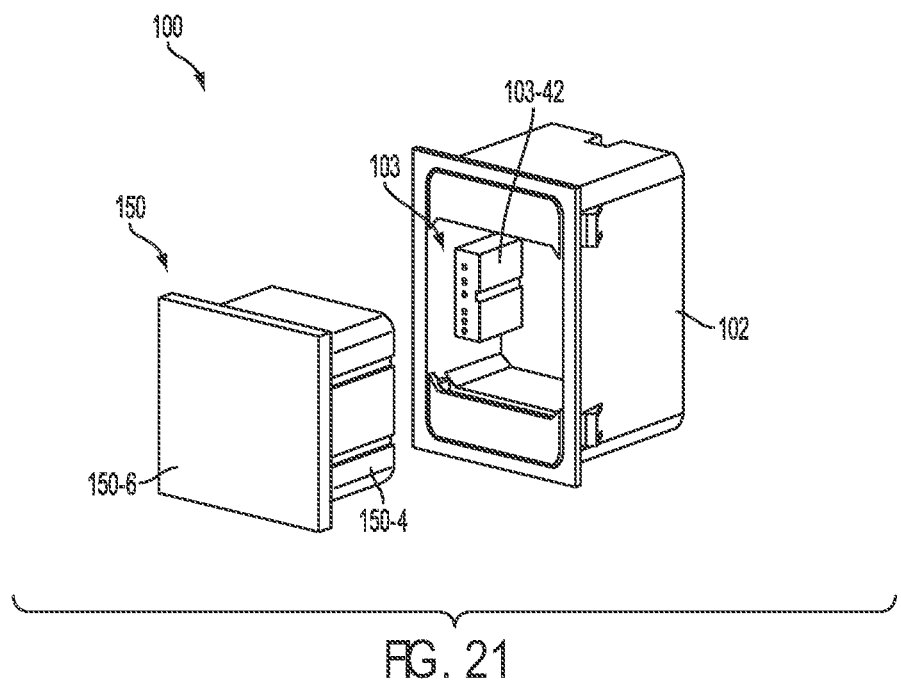
FIG. 21 is an exploded view of the modular electrical wiring system in accordance with another embodiment of the present invention.
Figure 22:
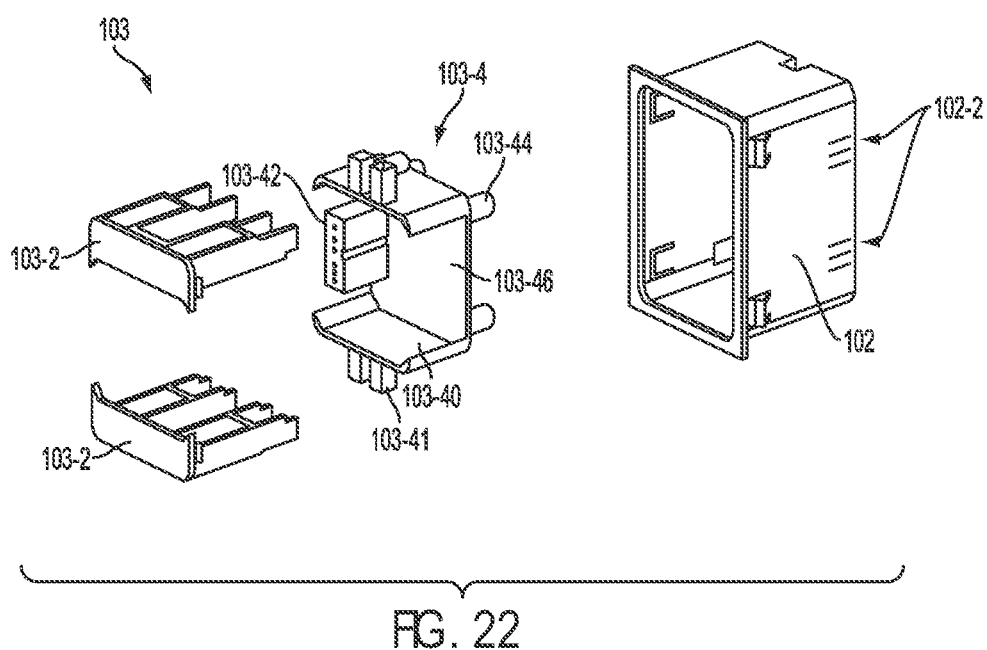
FIG. 22 is a detail exploded view of the modular electrical wiring system shown in FIG. 21.

As embodied herein and depicted in FIG. 21, an exploded view of the modular electrical wiring system in accordance with yet another embodiment of the present invention is disclosed. In this embodiment, the three types of electronic switches are interchangeable. The switches are interchangeable at the factory or may be configured to be interchangeable by the user. Stated differently, the electronic switch functionality implemented on the low voltage PCB is disposed within the switch module 150. The decorative cover 150-6 of the module would be used to implement the wave switch (FIGS. 6-9 and 11), the tap switch (FIGS. 12-16) or the touch switch (FIGS. 17-20). The power supply is provided by the separator assembly 103, which is inserted over the AC power PCB (FIG. 10) disposed in the back body 102. FIG. 22 is a detail exploded view of the modular electrical wiring system shown in FIG. 21. As shown, the back body 102 is sized as a three-module (i.e., a single gang size) device and easily accommodates the AC power PCB 110 (See FIG. 10). The separator assembly 103 includes alignment connectors 103-2 that mate with the separator side portions 103-40 and 103-41 at either end thereof. The separator 103-4 includes a jack 103-42 that functions much like J1/J100 (FIGS. 10-11). The AC circuit (FIG. 10) is disposed under the separator floor 130-46 which is separated from the floor of the back body 102 by stand-off elements 103-44.

The present invention may be implemented using a standard wiring device form factor. FIG. 23 is a front view of an electronic switch 160 in accordance with yet another embodiment of the present invention. In this embodiment, a wave, tap and touch switch embodiments with a centrally disposed locator light 160-2 are disclosed. FIG. 24 is a front view of an electronic switch 170 in accordance with yet another embodiment of the present invention. In this embodiment, a wave, tap and touch switch embodiments without a centrally disposed locator light are disclosed.

As embodied herein and depicted in FIGS. 25A-25D, various embodiments of LED locator lenses 250 are disclosed. While the embodiments described below use the decorative cover 130-6 as an example, one skilled in the art will understand that any of the decorative covers (120-6, 130-6, 140-6, and 150-6) may employ any one of the locator lens embodiments described below. Moreover, it should be understood that any of the following embodiments may be used to implement any of the lenses previously depicted herein (e.g., lens 130-60 in FIG. 12A, lens 140-60 in FIG. 17A, or lens 160-2 in FIG. 23).

Figure 25A:
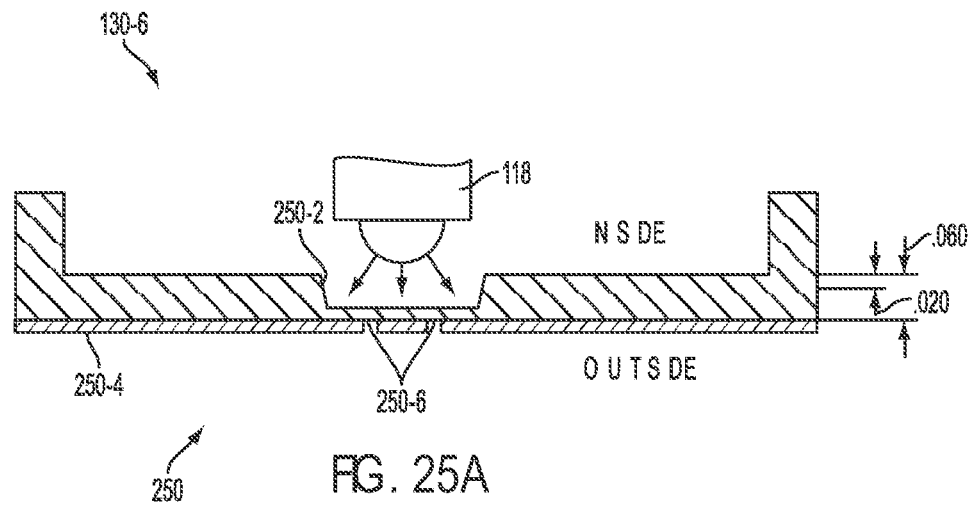
FIGS. 25A-25D are directed to various embodiments of LED locator lenses in accordance with the present invention.

Referring to FIG. 25A, one embodiment of the LED locator lens 250 in accordance with the present invention is disclosed. Locator lens 250 includes a circular stepped region 250-2 formed in rear surface of the decorator cover 130-6 proximate the LED locator light 118. As shown, the cross-sectional thickness within the stepped region is relatively thin, at about 0.020 inches. The stepped region 250-2 is formed by injection molding or by another similar process. The front portion of the decorator cover is painted with a dark gray paint 250-4 that is substantially opaque. The paint layer 250-4 is laser etched to reveal a thin layer of translucent material in an annular ring region 250-6 that is sometimes referred to as the "bull's eye." Since the paint 250-4 is removed and the plastic region 250-2 is relatively thin, when light is emitted by locator LED 118, the annular ring 250-6 is illuminated for the user. Obviously, if the optional LED locator light 118 is not installed here or in other embodiments, the so-called "bull's eye" will still be visible to the user even though it is not back-lit by the locator light 118.

Figure 25B:
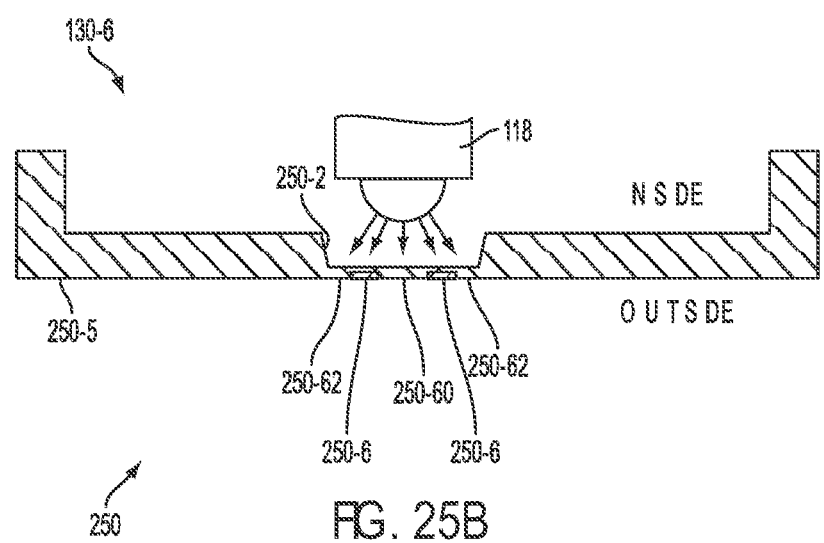

Referring to FIG. 25B, another embodiment of the LED locator lens 250 is disclosed. Like the previous embodiment, the locator lens 250 includes a circular stepped region 250-2 that is formed in rear surface of the decorator cover 130-6 proximate the LED locator light 118. In this version, the front surface of the decorator cover 130-6 is not painted. The outside surface is of a uniform color except where the cover material is etched by a laser to form an annular ring pattern 250-6. In this case, when the material is etched, it changes to a darker color or less translucent. Thus, the annular ring 250-6 is not illuminated when the locator light 118 is ON. Instead, the region 250-60 inside the annular ring 250-6 is translucent and illuminated when the LED 118 is ON. In addition, the region 250-62 outside the annular ring 250-6 may provide a lesser degree of illumination when the LED 118 is emitting light. This is especially true if the outside diameter of the stepped region 250-2 is greater than the outside diameter of the annular ring 250-6. Although the laser etch has darkened the plastic in the annular ring 250-6, this region is typically not fully opaque.

Figure 25C:
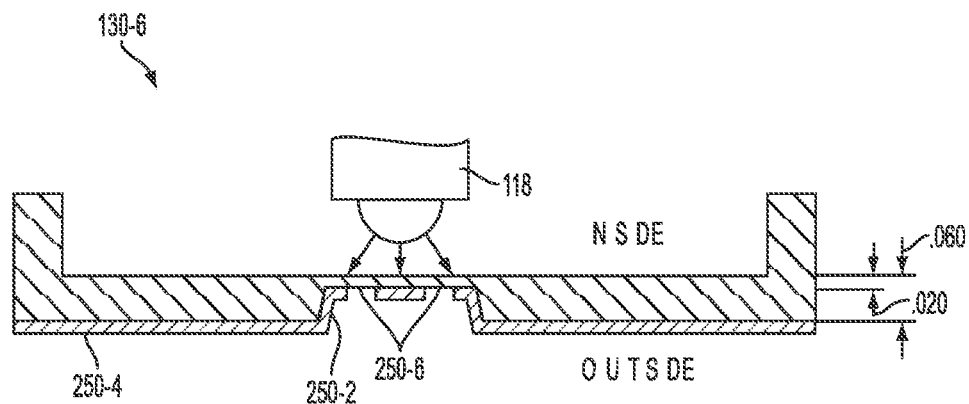

Referring to FIG. 25C, yet another embodiment of the LED locator lens 250 is disclosed. In this embodiment, the locator lens 250 includes a circular stepped region 250-2 formed in the front surface of the decorator cover 130-6 proximate the LED locator light 118. The stepped region 250-2 in this embodiment is also formed by an injection molding process or an equivalent. Again, the cross-sectional thickness within the stepped region is relatively thin, at about 0.020 inches. Like the embodiment of FIG. 25A, the front portion of the decorator cover is painted with a dark gray paint 250-4 that is substantially opaque. The paint layer 250-4 is laser etched to reveal a thin layer of translucent material in the annular ring region 250-6. Since the paint 250-4 is removed and the region 250-2 is relatively thin, the annular ring 250-6 is illuminated when light is emitted by locator LED 118.

Figure 25D:
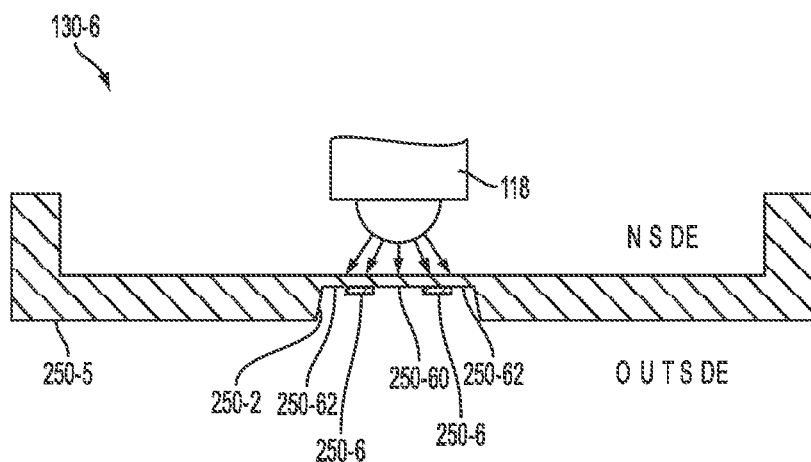

Referring to FIG. 25D, yet another embodiment of the LED locator lens 250 is disclosed. Like the embodiment, of FIG. 25C, the locator lens 250 includes a circular stepped region 250-2 formed in the front surface of the decorator cover 130-6 proximate the LED locator light 118. Like the embodiment of FIG. 25B, the front surface of the decorator cover 130-6 is not painted. The outside surface is of a uniform color except where the cover material is etched by a laser to form an annular ring pattern 250-6. When the material is etched, it changes to a darker color or becomes less translucent. Thus, the annular ring 250-6 is not illuminated when the locator light 118 is ON. Instead, the region 250-60 inside the annular ring 250-6 is translucent and illuminated when the LED 118 is ON. Moreover, the region 250-62 outside the annular ring 250-6 may provide a lesser degree of illumination when the LED 118 is emitting light if the outside diameter of the stepped region 250-2 is greater than the outside diameter of the annular ring 250-6. Although the laser etch has darkened the plastic in the annular ring 250-6, this region is typically not fully opaque.

The bull's eye feature shown in conjunction with the family of electronic switches described herein, may also be incorporated in other wiring devices including those that employ the framing system depicted in FIGS. 1-5.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An electronic wave switch device for controlling a load, the device comprising:
    a housing assembly including a front cover assembly having a user interface, a back body assembly, a ground clip extending from the back body assembly, and a plurality of terminals configured to be coupled to an AC power source and the load, wherein the housing assembly is configured to be inserted into and mate with a frame coupled to a device wall box; and
    a circuit assembly disposed inside the housing assembly coupled to the plurality of terminals, the circuit assembly comprising a printed circuit board, the printed circuit board including a sensor coupled to a processor, wherein the sensor is configured to receive and detect an input stimulus in response to movement of an object a predetermined distance from the sensor, and wherein the processor is configured to propagate a switch actuation command in response to detecting the input stimulus, wherein the circuit assembly is electrically referenced to the ground clip, wherein the ground clip is positioned to engage with the frame when the housing assembly is mated with the frame.

2. The electronic wave switch device of claim 1, wherein the printed circuit board further includes a signal emitter configured to emit a predetermined signal.

3. The electronic wave switch device of claim 2, wherein the sensor includes a photo-sensitive element configured to measure light reflected from the signal emitter by the object wherein the signal emitter is a light emitting diode (LED).

4. The electronic wave switch device of claim 3, wherein the sensor is configured to detect light of a predetermined frequency.

5. The electronic wave switch device of claim 3, wherein the light emitted from the LED is infrared light.

6. The electronic wave switch device of claim 1, wherein the predetermined distance is adjustable according to a potentiometer in electrical communication with the processor.

* * * * *